(12) United States Patent
Liu et al.

(10) Patent No.: US 11,127,626 B2
(45) Date of Patent: \*Sep. 21, 2021

(54) METHOD OF MANUFACTURING A SEMICONDUCTOR DEVICE

(71) Applicant: TAIWAN SEMICONDUCTOR MANUFACTURING COMPANY LTD., Hsinchu (TW)

(72) Inventors: Jack Liu, Taipei (TW); Wei-Cheng Wu, Hsinchu County (TW); Charles Chew-Yuen Young, Cupertino, CA (US); Sing-Kai Huang, Yunlin County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/033,759

(22) Filed: Sep. 26, 2020

(65) Prior Publication Data

US 2021/0013094 A1 Jan. 14, 2021

Related U.S. Application Data

(63) Continuation of application No. 16/217,469, filed on Dec. 12, 2018, now Pat. No. 10,796,947.

(51) Int. Cl.
*H01L 21/00* (2006.01)
*H01L 21/768* (2006.01)
*H01L 21/033* (2006.01)
*H01L 21/02* (2006.01)

(52) U.S. Cl.
CPC .... *H01L 21/76802* (2013.01); *H01L 21/0332* (2013.01); *H01L 21/0337* (2013.01); *H01L 21/76877* (2013.01); *H01L 21/02164* (2013.01); *H01L 21/76837* (2013.01)

(58) Field of Classification Search
None
See application file for complete search history.

(56) References Cited

U.S. PATENT DOCUMENTS 10,796,947 B2 * 10/2020 Liu ................... H01L 21/76802

\* cited by examiner

*Primary Examiner* — Reema Patel
(74) *Attorney, Agent, or Firm* — WPAT, P.C.; Anthony King

(57) ABSTRACT

A method of manufacturing a semiconductor device includes providing a wafer having a first surface, wherein the wafer includes a gate electrode having a top surface, and the top surface is leveled with the first surface; and forming an alignment structure on the top surface. The method further includes forming a photoresist on the alignment layer to cover a portion of the top surface; and removing portions of the alignment layer uncovered by the photoresist to form an alignment structure on the top surface. The method further includes forming a dielectric surrounding the alignment structure on the first surface and over the alignment structure, removing a portion of the dielectric to expose the alignment structure by CMP; removing the alignment structure to expose at least a portion of the top surface of the gate electrode, and forming a gate conductor over and in contact with the gate electrode.

20 Claims, 24 Drawing Sheets

710 providing a wafer having a first surface, wherein the wafer includes a gate electrode having a top surface, and the top surface of the gate electrode is substantially level with the first surface; —71 forming an alignment structure on the top surface of the gate electrode; —72 forming a dielectric surrounding the alignment structure on the first surface; —73 removing the alignment structure to expose at least a portion of the gate electrode; and —74 forming a gate conductor over and in contact with the gate electrode. —75

| providing a wafer having a substrate and a gate electrode, wherein the substrate has an oxide diffusion region, and the gate electrode over the substrate and disposed in the oxide diffusion area; | —71 |

↓

| disposing an alignment structure over the gate electrode, wherein the alignment structure does not cover the portion of the oxide diffusion region that is not the gate electrode from a top view; | —72 |

↓

| forming an dielectric surrounding the alignment structure, wherein the dielectric is made with a material different from the alignment structure; | —73 |

↓

| removing the alignment structure to expose the at least a portion of the gate electrode; and | —74 |

↓

| forming a conductor in contact with the exposed gate electrode. | —75 |

FIG. 3

METHOD OF MANUFACTURING A SEMICONDUCTOR DEVICE

PRIORITY CLAIM AND CROSS REFERENCE

This application is a continuation application of a U.S. patent application entitled METHOD OF MANUFACTURING A SEMICONDUCTOR DEVICE, Ser. No. 16/217,469, filed Dec. 12, 2018.

BACKGROUND

Recently, semiconductor devices are becoming steadily smaller while having more functionality and greater amounts of integrated circuitry. To accommodate the miniaturized scale of the semiconductor device, 3D integrated circuits (3DICs), have emerged as an effective alternative to further reduce the physical size of a semiconductor device.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIG. 1 is a flowchart representing a method of manufacturing a semiconductor device according to aspects of the present disclosure in one or more embodiments.

FIG. 3 is a flowchart representing a method of manufacturing a semiconductor device according to aspects of the present disclosure in one or more embodiments.

DETAILED DESCRIPTION

Figure 2:
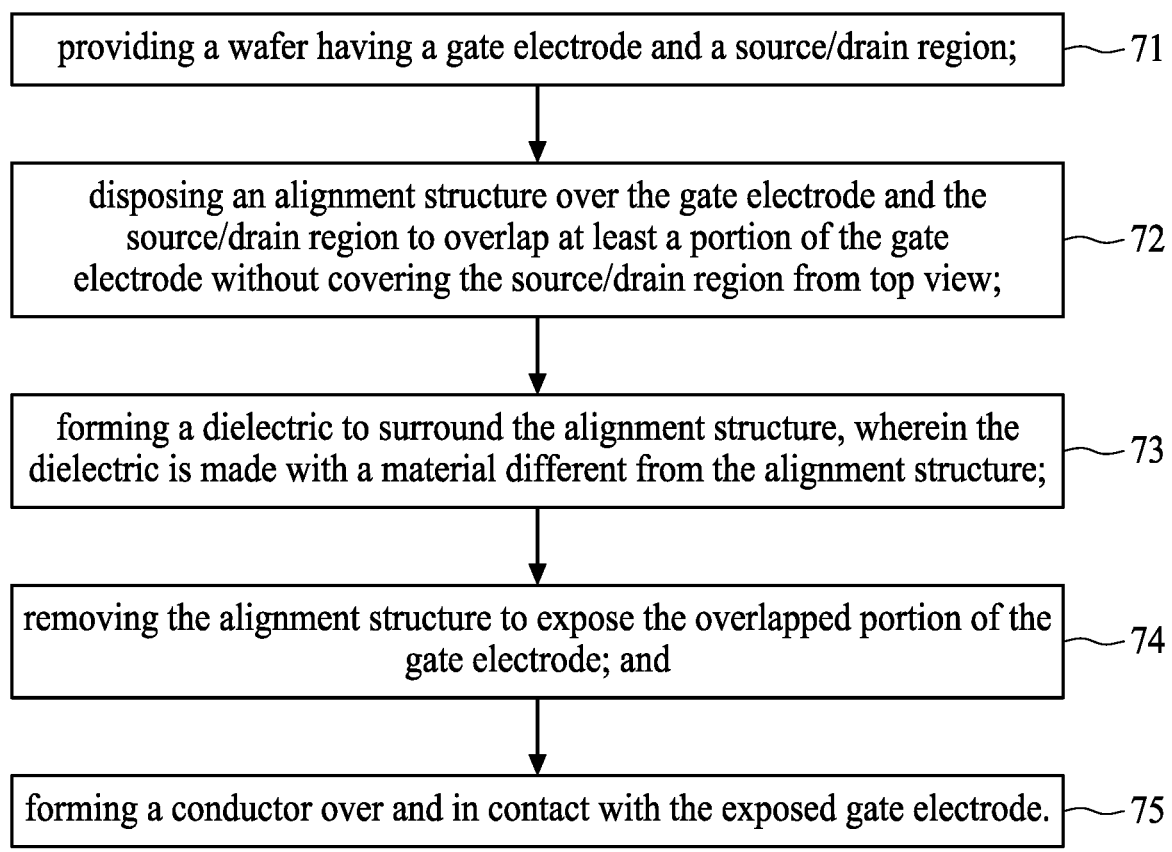
FIG. 2 is a flowchart representing a method of manufacturing a semiconductor device according to aspects of the present disclosure in one or more embodiments.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, terms such as "first," "second" and "third" describe various elements, components, regions, layers and/or sections, but these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation.

Advances in semiconductor processing are being made in rapid succession, resulting in ongoing reductions in minimum feature sizes and process scaling. Conventional fabrication of semiconductor structures places the gate contact outside of the oxide diffusion region, to avoid electrical shorting and poor device performance or non-operation. However, the above-mentioned design is subject to design restrictions and occupies more area. As the semiconductor process nodes advance to smaller minimum feature sizes, for example, of 28 nm, 22 nm, and below, the areas available for conductor or contact plugs on device features such as gate electrodes or the respective substrate are reduced. Accordingly, as semiconductor devices continue to become smaller, area efficiency of the semiconductor device becomes more and more important.

Typically, a wafer includes a gate electrode and source/drain regions on opposite sides of the gate electrode. Contacts are used to form the vertical electrical connections between a conductor layer such as a first level metal (known as M1), and an oxide diffusion region or a gate region formed below the first level metal in an integrated circuit structure. Each electrode has a contact that is electrically connected to it. If a contact is electrically connected to a plurality of electrodes, an electrical short may be created, resulting in poor device performance or non-operation.

The present disclosure therefore provides a method of manufacturing a semiconductor device. The method includes providing a wafer having a first surface. The wafer includes a gate electrode having a top surface, wherein the top surface of the gate electrode is substantially level with the first surface. The method further includes forming an alignment structure on the top surface of the gate electrode, and forming an inter-layer dielectric (ILD) surrounding the alignment structure on the first surface. The method further includes removing the alignment structure to expose at least a portion of the top surface of the gate electrode, and forming a conductor over and in contact with the gate electrode. Accordingly, the misalignment issue is solved.

FIG. 1 is a flowchart of a method 710 according to an embodiment of the present disclosure. FIG. 2 is a flowchart of a method 720 according to another embodiment of the present disclosure. FIG. 3 is a flowchart of a method 730 according to another embodiment of the present disclosure. FIGS. 4 to 24 are cross-sectional views and top views illustrating exemplary operations for manufacturing a semiconductor device of the present disclosure, wherein method 710, method 720 or method 730 can be implemented. In the present disclosure, method 710, method 720 and method 730 for manufacturing a semiconductor device are disclosed. In some embodiments, a semiconductor device having a gate contact may be manufactured by the method 710, the method 720 or the method 730. The methods 710, 720 and 730 include a number of operations and the description and illustration are not deemed as a limitation of the sequence of the operations.

Figure 4:
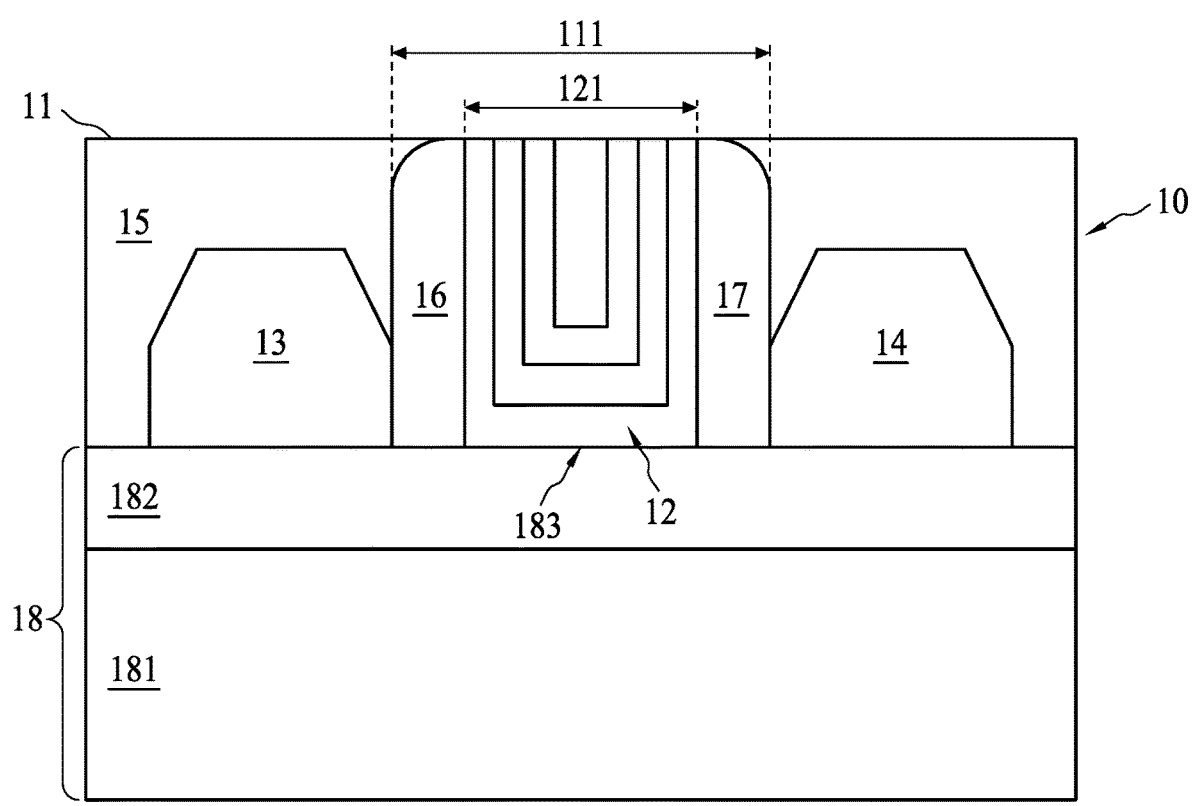
FIGS. 4 to 23 are cross-sectional views and top views of a semiconductor device at various stages in accordance with some embodiments of the present disclosure.

The methods 710, 720 and 730 begin with operation 71, in which a wafer 10 is provided as shown in FIG. 4. The wafer 10 has a first surface 11 and includes a gate electrode 12 having a top surface 121. The top surface 121 of the gate electrode 12 is substantially level with the first surface 11 of the wafer 10.

In some embodiments, the wafer 10 includes a substrate 18, and the gate electrode 12 is formed on the substrate 18. In some embodiments, the substrate 18 may be a semiconductor-on-insulator (SOI) substrate. In some embodiments, the substrate 18 includes a buried oxide (BOX) layer 181 and a silicon on insulator (SOI) layer 182. In some embodiments, the silicon on insulator (SOI) layer 182 is formed between the buried oxide BOX layer 181 and the gate electrode 12. In some embodiments, source and drain regions (referred to hereinafter as source/drain regions) 13, 14 are formed in the substrate 18. In some embodiments, the source/drain regions 13, 14 are raised source/drain regions. In some embodiments, the source/drain regions 13, 14 are raised source/drain regions and are located on opposite sides of the gate electrode 12. In some embodiments, the source/drain regions 13, 14 are implanted in the substrate 18. In some embodiments, the gate electrode 12 and the source/drain regions 13, 14 are located in an oxide diffusion region 183 of the substrate 18.

In some embodiments, a first inter-layer dielectric (ILD) 15 is formed over substrate 18. In some embodiments, the source/drain regions 13, 14 are raised on the substrate 18 and are embedded in the first ILD 15. In some embodiments, the first ILD 15 may be formed of a low-k dielectric material having a k value smaller than about 3.0, or smaller than about 2.5. In some embodiments, the first ILD 15 includes an oxide such as phospho-silicate glass (PSG), boro-silicate glass (BSG), boron-doped phospho-silicate glass (BPSG), tetra ethyl ortho silicate (TEOS) oxide, or the like.

In some embodiments, the wafer 10 further includes a first spacer 16 and a second spacer 17 on opposite sides of the gate electrode 12 and embedded in the ILD 15 of the wafer 10. In some embodiments, a side of the first spacer 16 facing away from the gate electrode 12 and a side of the second spacer 17 facing away from the gate electrode 12 define a first area 111 of the first surface 11. In some embodiments, a side of the first spacer 16 connecting to the source region 13 and a side of the second spacer 17 connecting to the drain region 14 define a first area 111 of the first surface 11. In some embodiments, the first spacer 16 and the second spacer 17 are located between the source/drain regions 13, 14.

In some embodiments, the gate electrode 12 includes one or more metal layers, including, for example, a dielectric layer, a barrier layer, a work function layer, or a metal fill layer. In some embodiments, the gate electrode 12 (including its composition layers) is an elongated structure extending over the substrate 18. In some embodiments, a top surface 121 of the gate electrode 12 is a long strip or a rectangle from a top view.

The wafer 10 may be conventionally fabricated, for example, using known processes and techniques. Further, unless noted otherwise, conventional processes and techniques may be used to achieve individual steps of the fabrication process described herein. However, although only a portion is shown for simplicity, it should be understood that, in practice, many such structures are typically included in the wafer 10.

Figure 9:
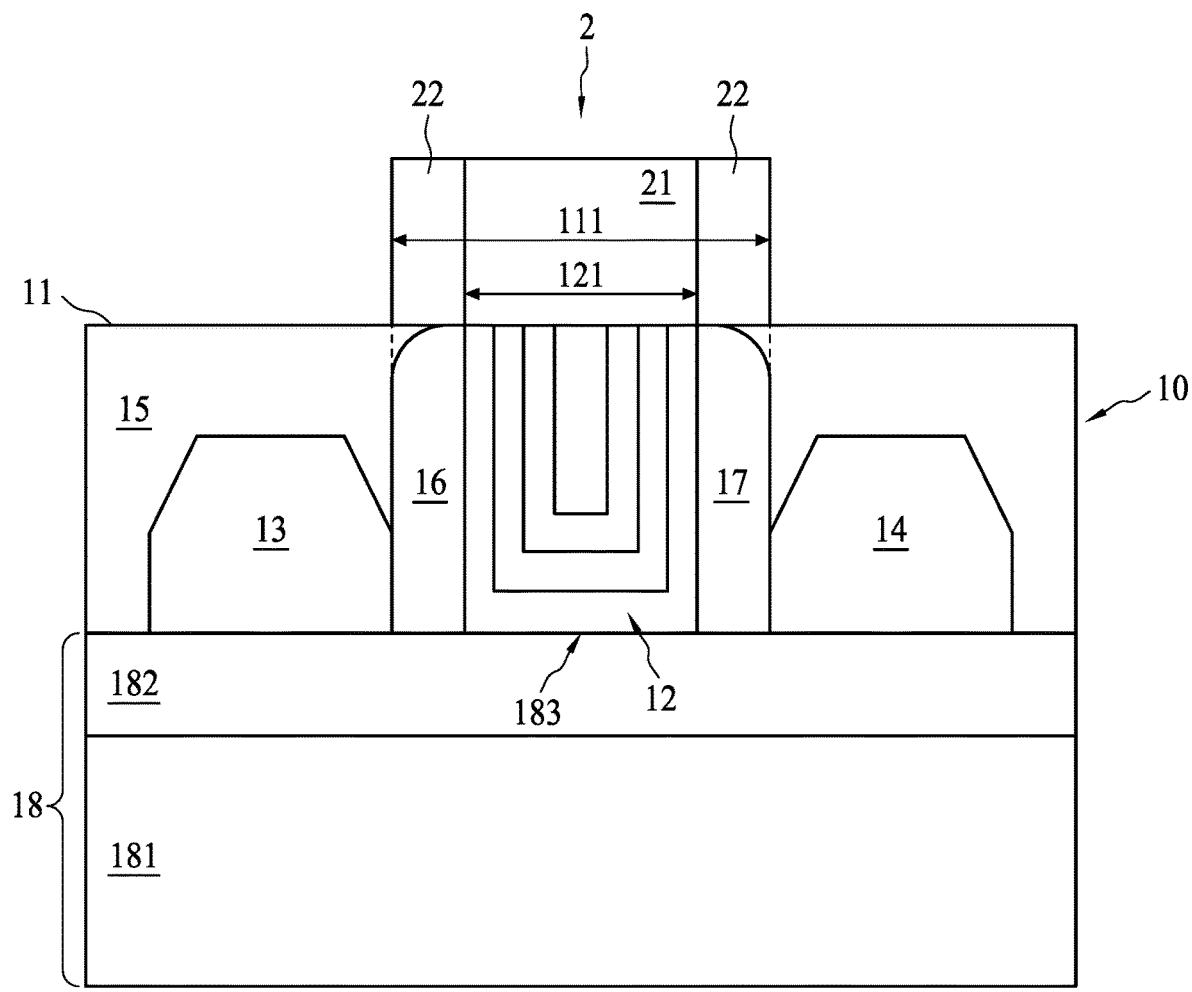

Methods 710, 720 and 730 continue with operation 72, in which an alignment structure 2 is formed over the gate electrode 12. The alignment structure 2 prepared by the methods 710, 720 and 730 is as shown in FIG. 9. In some embodiments, the alignment structure 2 is formed on the top surface 121 of the gate electrode 12. In some embodiments, the alignment structure 2 is formed over the gate electrode 12 to overlap at least a portion of the gate electrode 12 without covering the source/drain regions 13, 14 from a top view. In some embodiments, the alignment structure 2 does not cover the portion of the oxide diffusion region 183 apart from from the gate electrode 12 from a top view. It should be noted that the key to forming a conductor in the present disclosure over and in contact with the gate electrode 12 is that the alignment structure 2 is located on at least a portion of the top surface 121 of the gate electrode 12 but the alignment structure 2 does not cover the source/drain regions 13, 14 from a top view. If the alignment structure 2 is misaligned or covers the source/drain regions 13, 14 from a top view, the semiconductor device may exhibit shorting, resulting in poor device performance or non-operation. In some embodiments, the alignment structure 2 is formed on the first area 111 of the first surface 11; in other words, the alignment structure 2 is formed over the gate electrode 12 and may cover the first spacer 16 and the second spacer 17 from a top view. If the subsequently-formed gate contact is in contact with the gate electrode 12 and any of the spacers, no electrical short of the semiconductive device will occur. In some embodiments, the alignment structure 2 is an elongated structure extending over the top surface 121 of the gate electrode 12. In some embodiments, the alignment structure 2 extends over the top surface 121 of the gate electrode 12 and covers the first spacer 16 and the second spacer 17 from a top view. In some embodiments, the alignment structure 2 is a long strip or a rectangle from a top view. In some embodiments, the alignment structure 2 includes polysilicon.

In some embodiments, the alignment structure 2 includes a first alignment structure 21 formed on a portion of the top surface 121 of the gate electrode 12, and a second alignment structure 22 connected to the first alignment structure 21 to form the alignment structure 2 on the top surface 121 of the gate electrode 12. In some embodiments, the alignment structure 2 includes a first alignment structure 21 formed on a portion of the first area 111 of the first surface 11, and a second alignment structure 22 connected to the first alignment structure 21 to form the alignment structure 2 on the first area 111 of the first surface 11. FIGS. 5 to 8 are exemplary operations for manufacturing the alignment structure 2.

Figure 5:
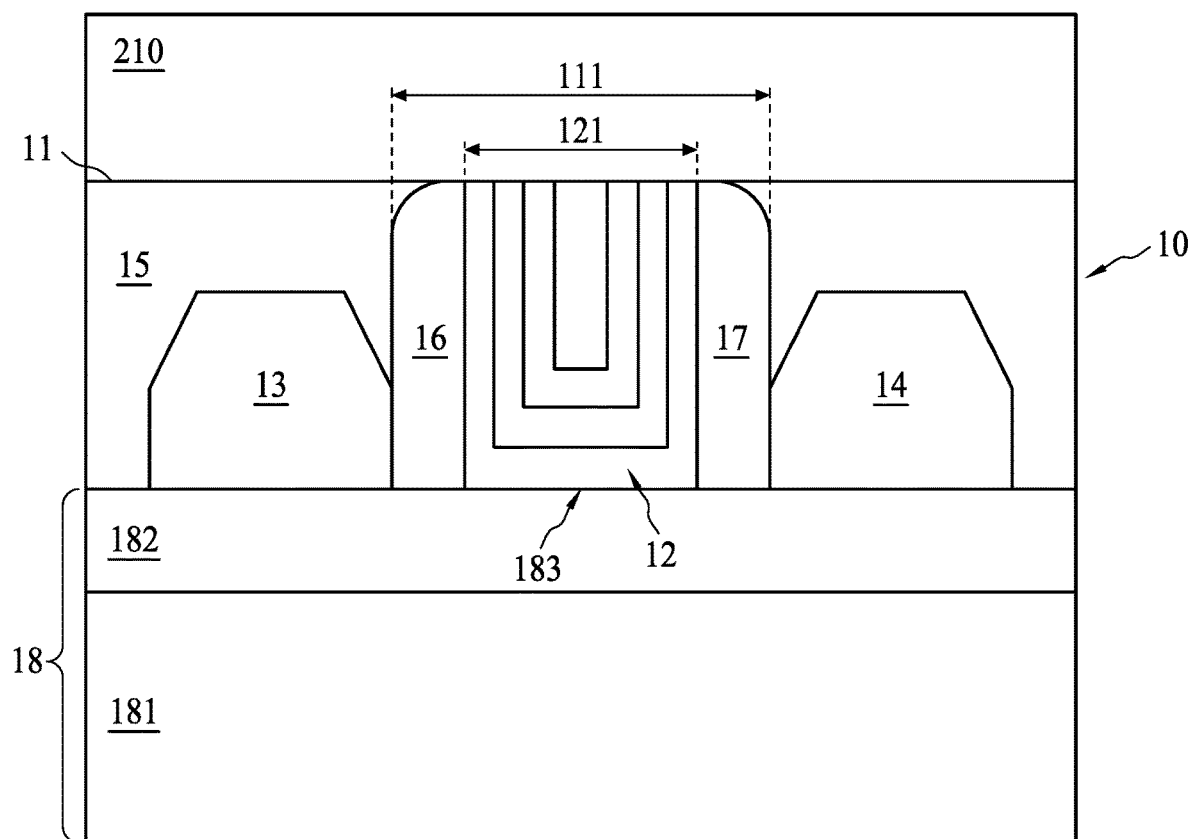

In some embodiments, a first alignment layer 210 is formed over the first surface 11 as shown in FIG. 5. In some embodiments, the first alignment layer 210 includes polysilicon.

Figure 6:
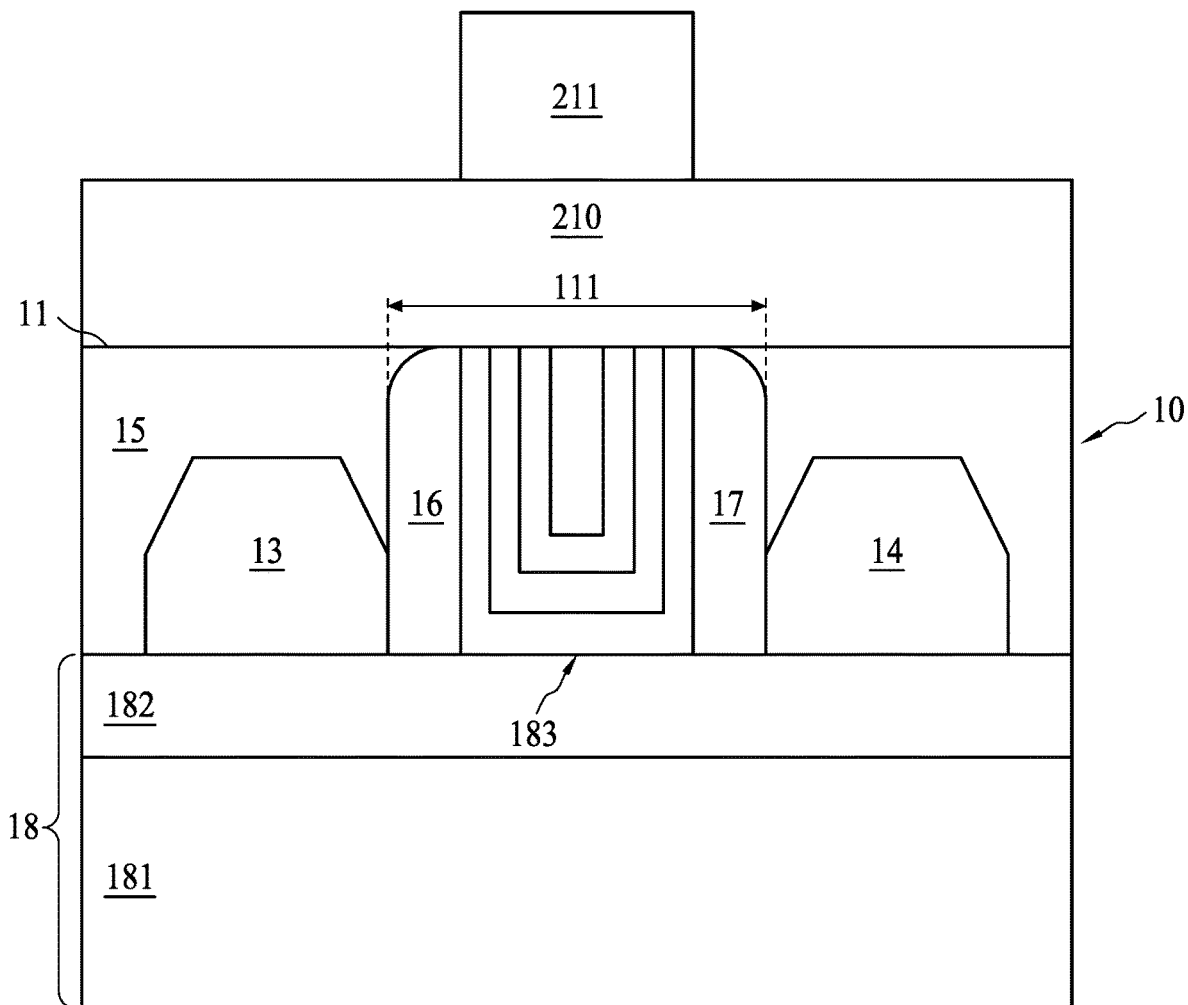
Figure 7:
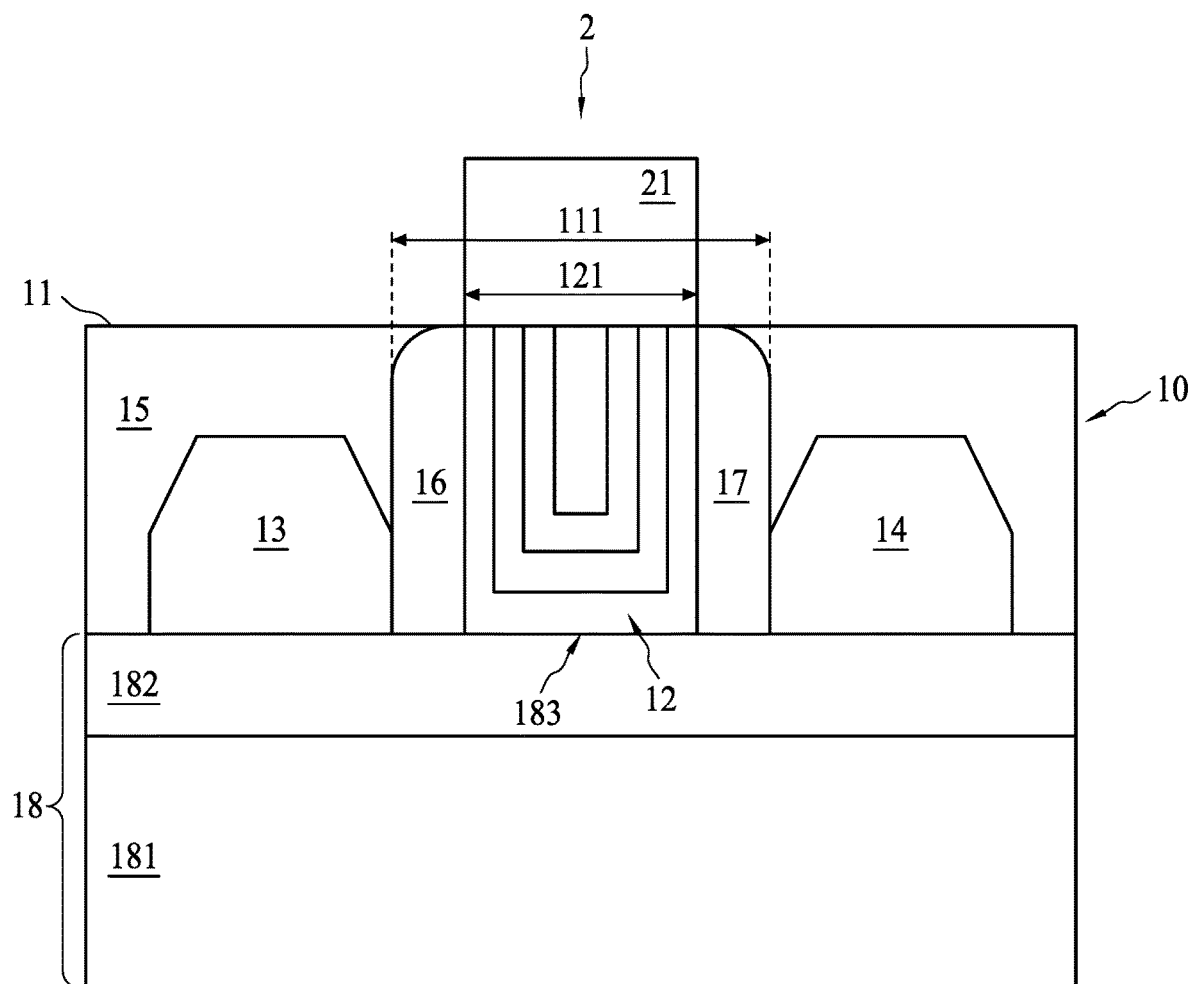

In some embodiments, the first alignment structure 21 may be formed by first depositing a first photoresist 211 on the first alignment layer 210. In some embodiments, the first photoresist 211 may then be patterned to cover portions of the first alignment layer 210 where the first alignment layer 210 is desired to be located as shown in FIG. 6. Once the photoresist has been formed and patterned, portions of the first alignment layer 210 not covered by the first photoresist 211 can be removed by a suitable etching process. The method further includes removing the first photoresist 211, and the first alignment structure 21 is thereby formed on at least a portion of the top surface 121 of the gate electrode 12 as shown in FIG. 7. In some embodiments, the first alignment structure 21 is formed on at least a portion of the first area 111 of the first surface 11 of the wafer 10.

Figure 8:
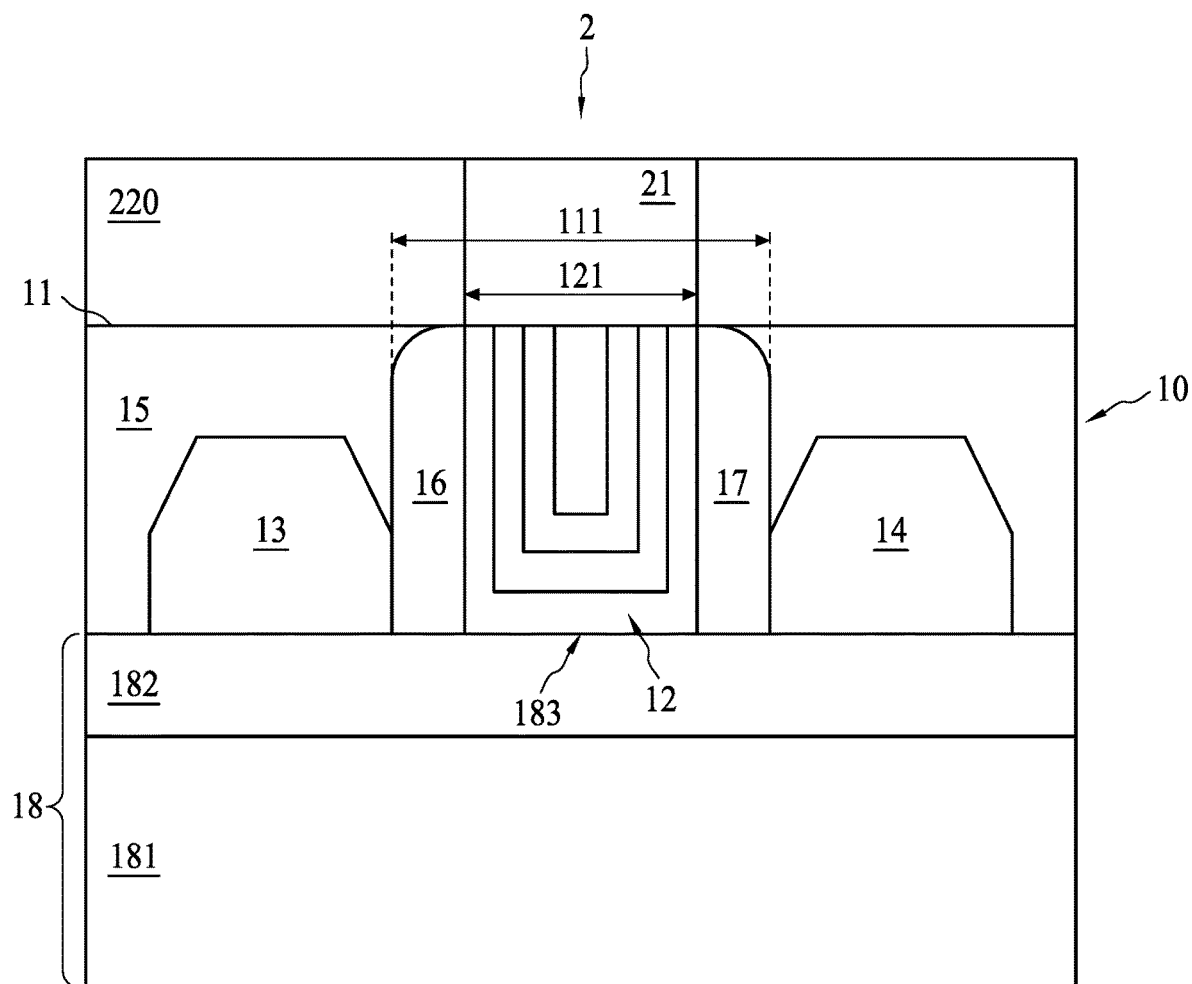

The method further includes the following operations. In some embodiments, the second alignment layer 220 is formed over the first surface 11 and surrounds the first alignment structure 21 as shown in FIG. 8.

In some embodiments, the second alignment structure 22 may be formed by first depositing a photoresist (not shown) on the second alignment layer 220 overlapping the first alignment structure 21. In some embodiments, the second alignment layer 220 includes polysilicon. The photoresist may then be patterned to cover portions of the second alignment layer 220 where the alignment structure 2 is desired to be located. Once the photoresist has been formed and patterned, portions of the second alignment layer 220 not covered by the photoresist can be removed by a suitable etching process. The method further includes removing the photoresist, and the alignment structure 2 is thereby formed in the first area 111 of the first surface 11 as shown in FIG. 9. In some embodiments, the second alignment structure 22 thus formed is surrounded by the first alignment structure 21 from a top view.

Figure 10:
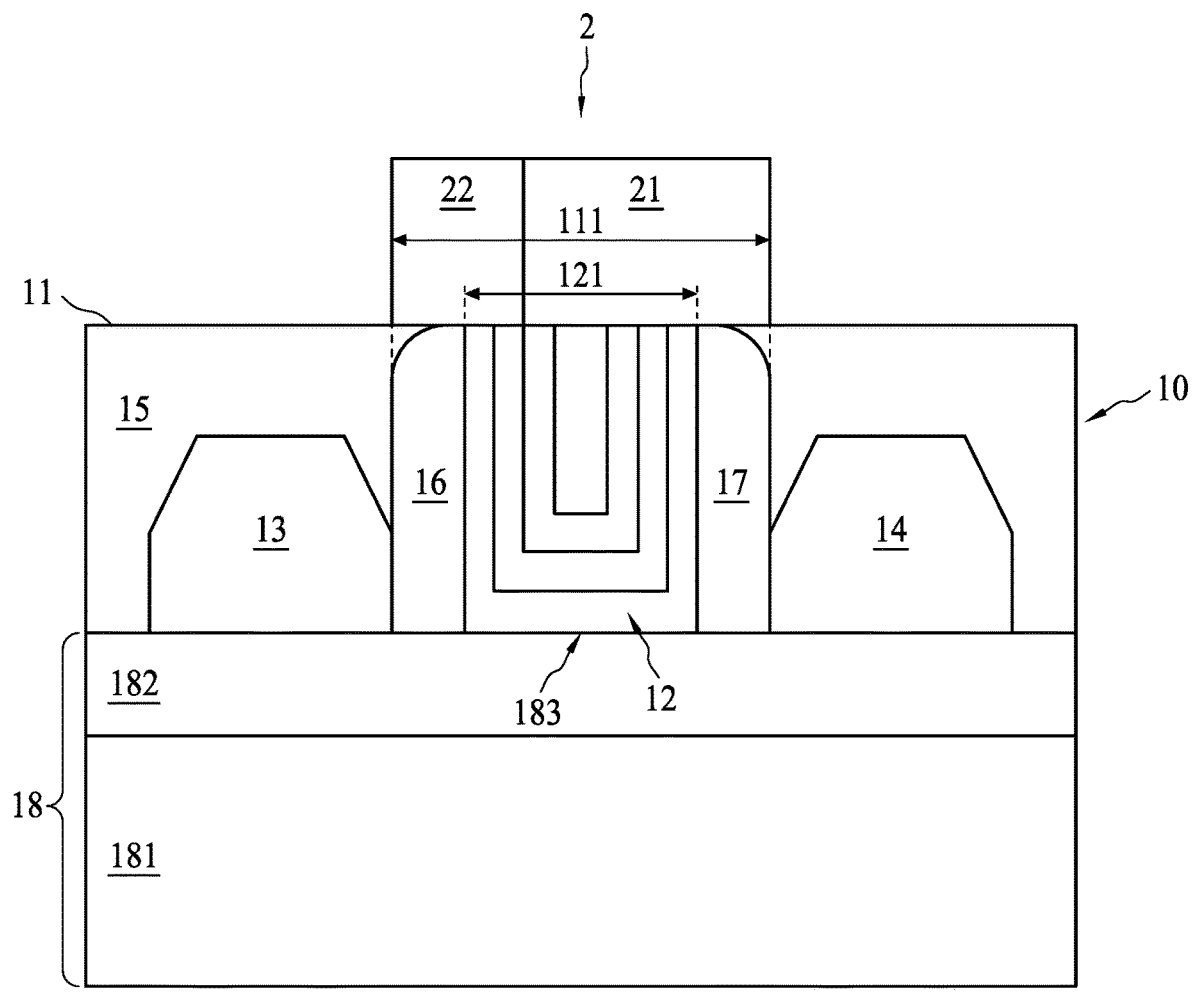

In some embodiments, the first alignment structure 21 may be positioned off center (as shown in FIG. 10) or may not completely cover the top surface 121 of the gate electrode 12. Referring to FIG. 10, as long as the first alignment structure 21 is formed in the first area 111 of the first surface 11, by subsequently forming the second alignment structure 22, the alignment structure 2 may still be located over the top surface 121 of the gate electrode 12, or may at least cover a portion of the top surface 121 of the gate electrode 12.

In some embodiments, the alignment structure 2 may be further patterned. In some embodiments, the alignment structure 2 can become smaller or can be divided into a plurality of smaller alignment structures 2. In some embodiments, a second photoresist 23 is formed on the alignment structure 2 and the first surface 11 of the wafer 10.

Figure 11:
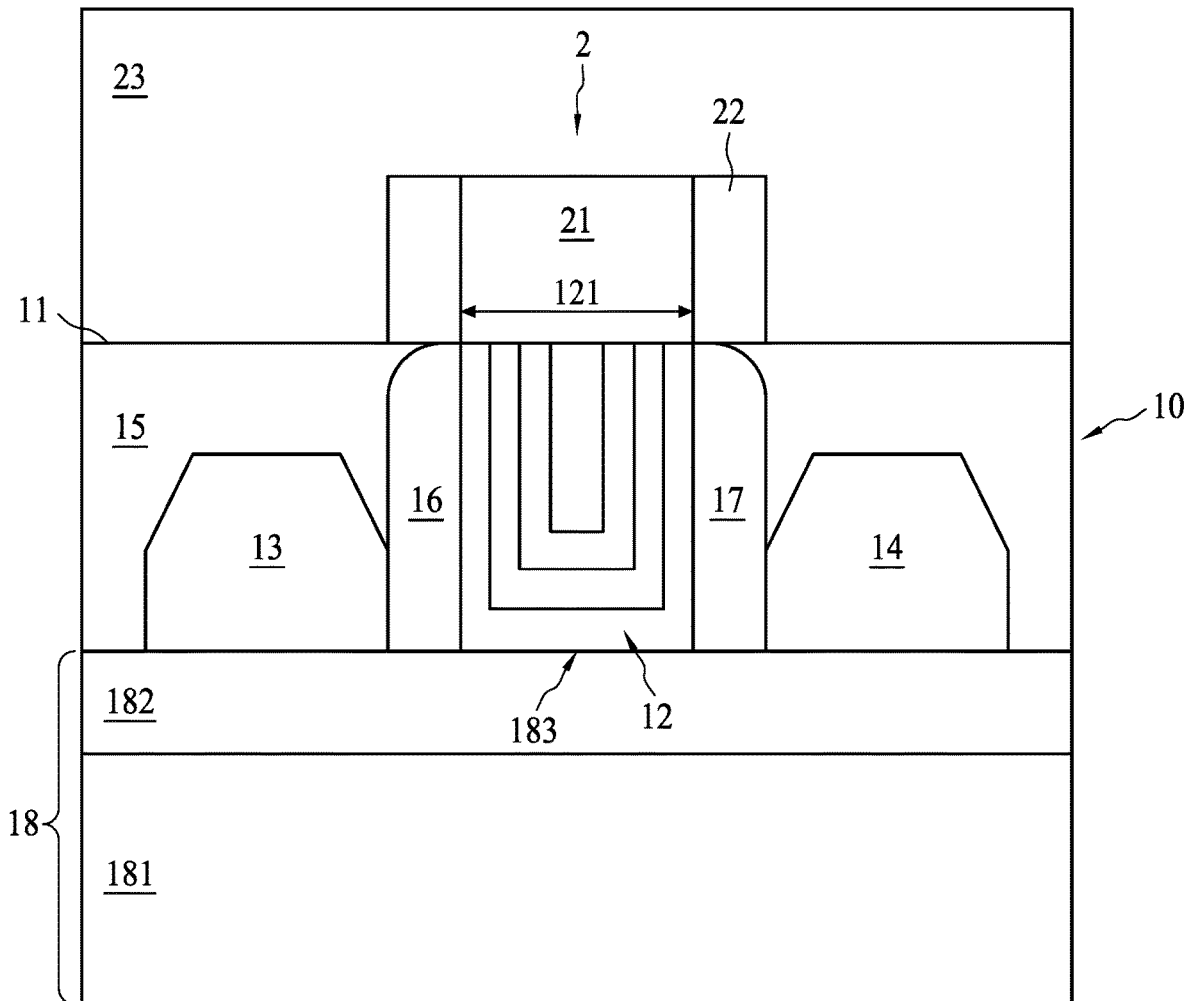
Figure 12:
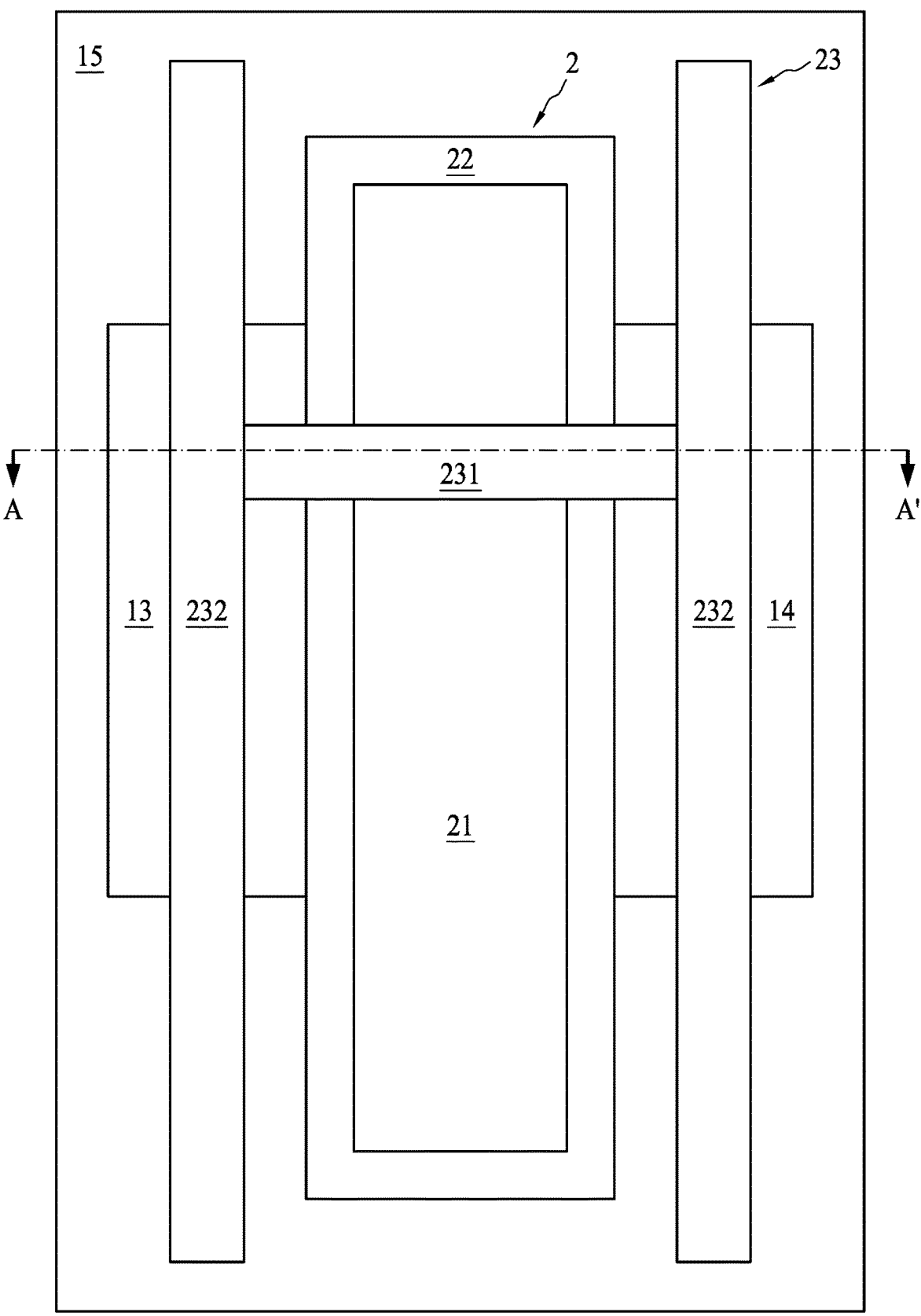
Figure 13:
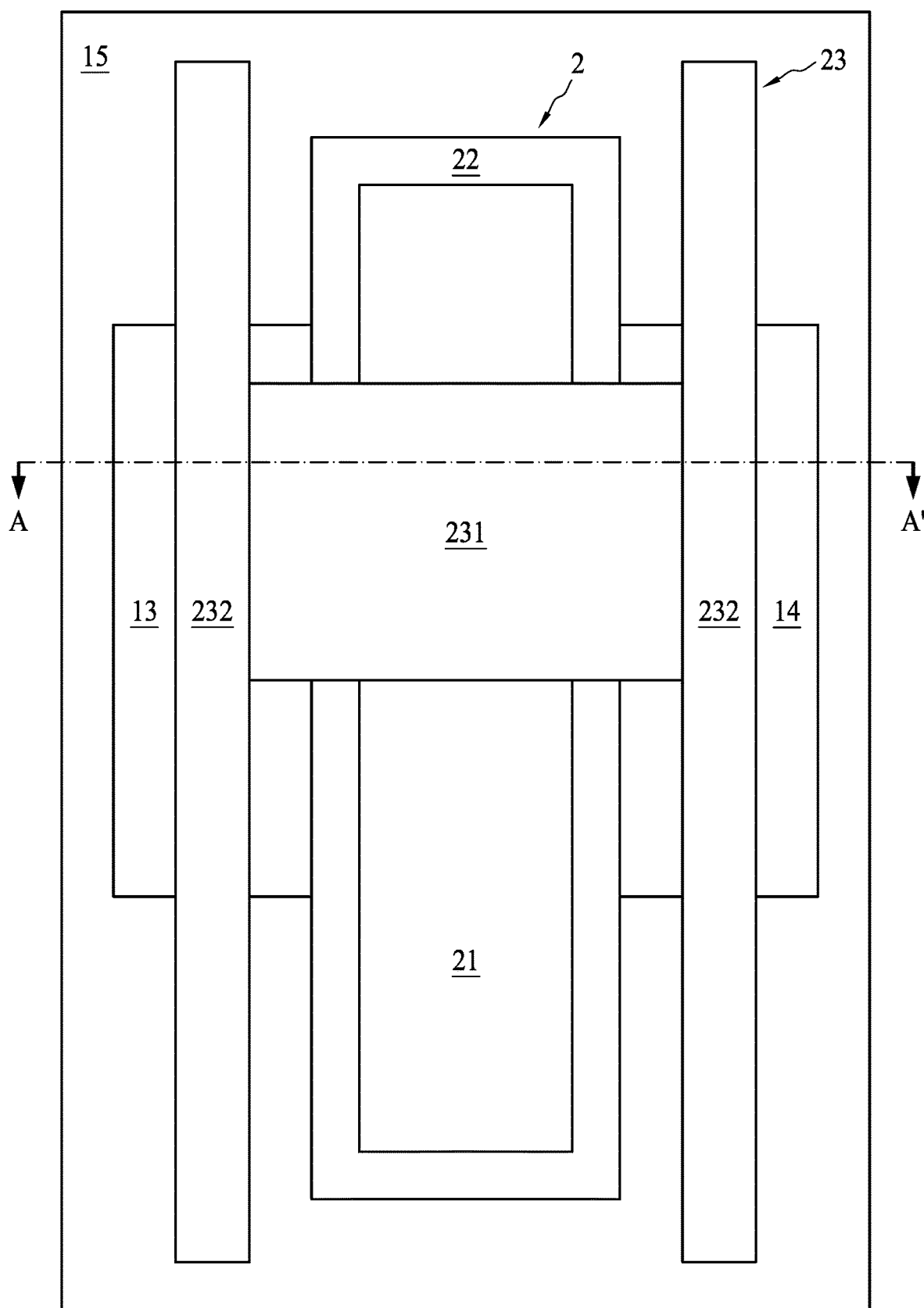
Figure 14:
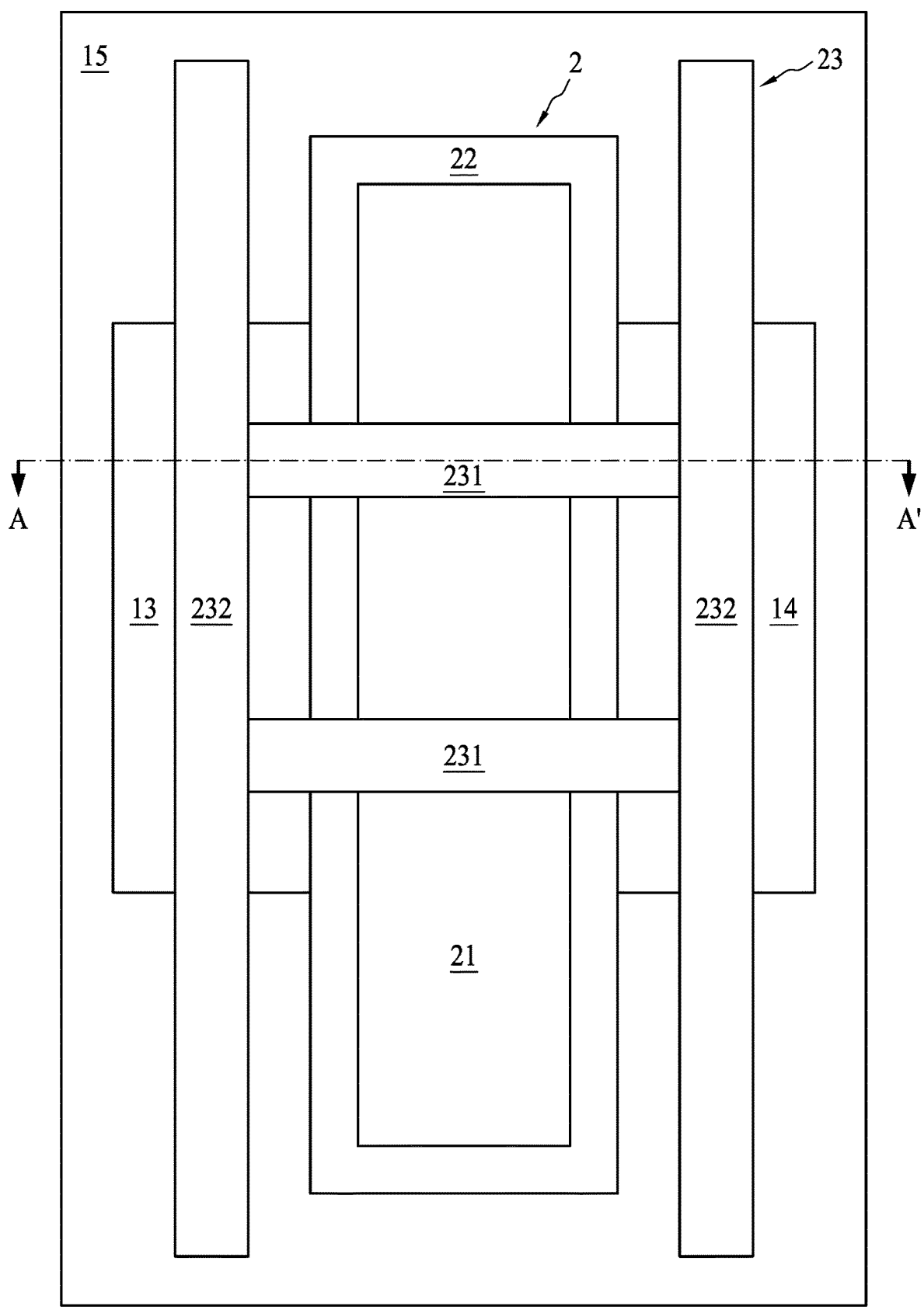

Referring to FIGS. 11 to 14, the respective top view of the structure shown in FIG. 11 is illustrated in FIGS. 12 to 14. FIG. 11 is a schematic cross sectional view of the semiconductor structure along AA of FIGS. 12-14. As shown in FIGS. 11 to 14, a second photoresist 23 may be patterned to cover a portion where the alignment structure 2 is desired to be located. Ideally, the dimensions of the patterned second photoresist 23 correspond exactly to the dimensions of the remaining alignment structure 2. However, to account for the inexactness of semiconductor processing, the dimensions of the remaining portion of the alignment structure 2 are actually slightly smaller than the dimensions of the patterned second photoresist 23. Considering the aforementioned effect of the etching process, in some embodiments, the second photoresist 23 may be patterned to cover a portion of the top surface 121 of the gate electrode 12 and a portion of the first area 111. In some embodiments, the second photoresist 23 may be patterned to cover a portion of the first area 111 and a portion of the source/drain regions 13, 14 from a top view. In some embodiments, the alignment structure 2 is a rectangle from a top view, a first region 231 of the second photoresist 23 may cross over a portion of the top surface of the alignment structure 2 and may extend beyond the two sides of the alignment structure 2 from a top view, and two second regions 232 of the second photoresist 23 may be respectively disposed at ends of the first region 231. In some embodiments, the second regions 232 are perpendicular to the first region 231. In some embodiments, the second photoresist 23 may be patterned in an H-shaped form as shown in FIGS. 12 and 13, or may be ladder-shaped as shown in FIG. 14.

Figure 15:
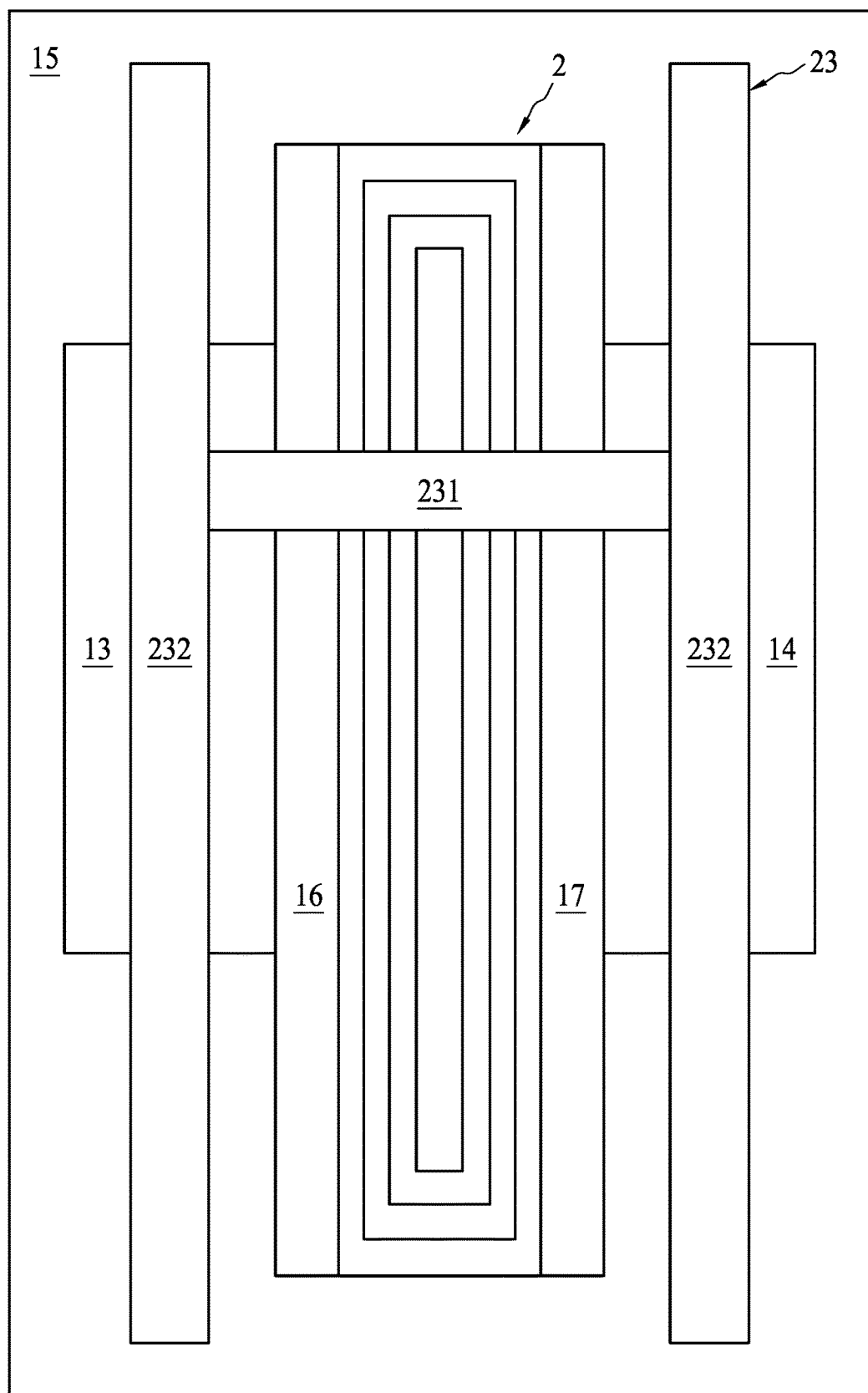

Referring to FIG. 15, once the second photoresist 23 has been formed and patterned, portions of the alignment structure 2 not covered by the second photoresist 23 can be removed by a suitable etching process. The method further includes removing the second photoresist 23, leaving at least one alignment structure 2 formed on a portion of the top surface 121 of the gate electrode 12.

Figure 16:
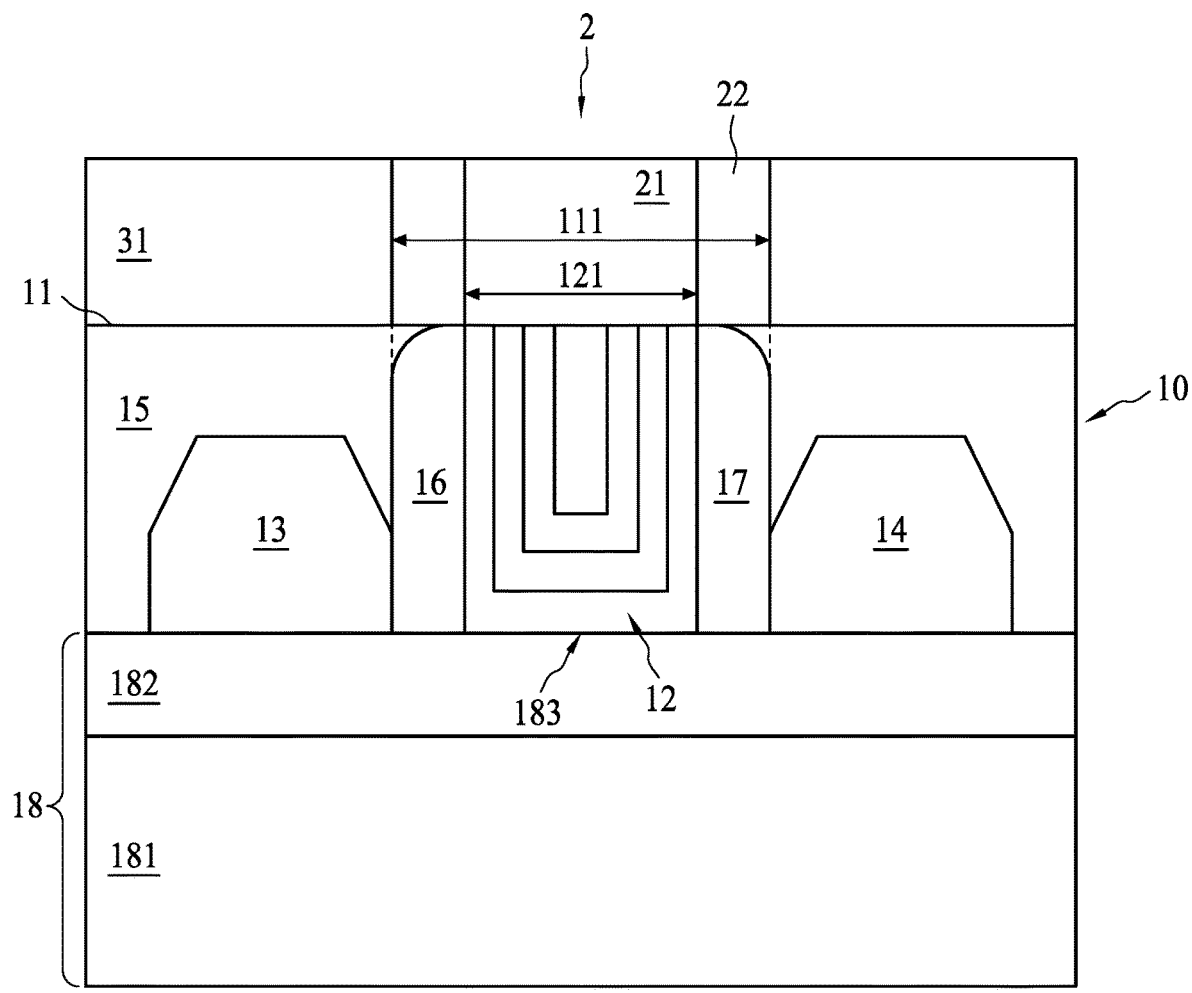
Figure 17:
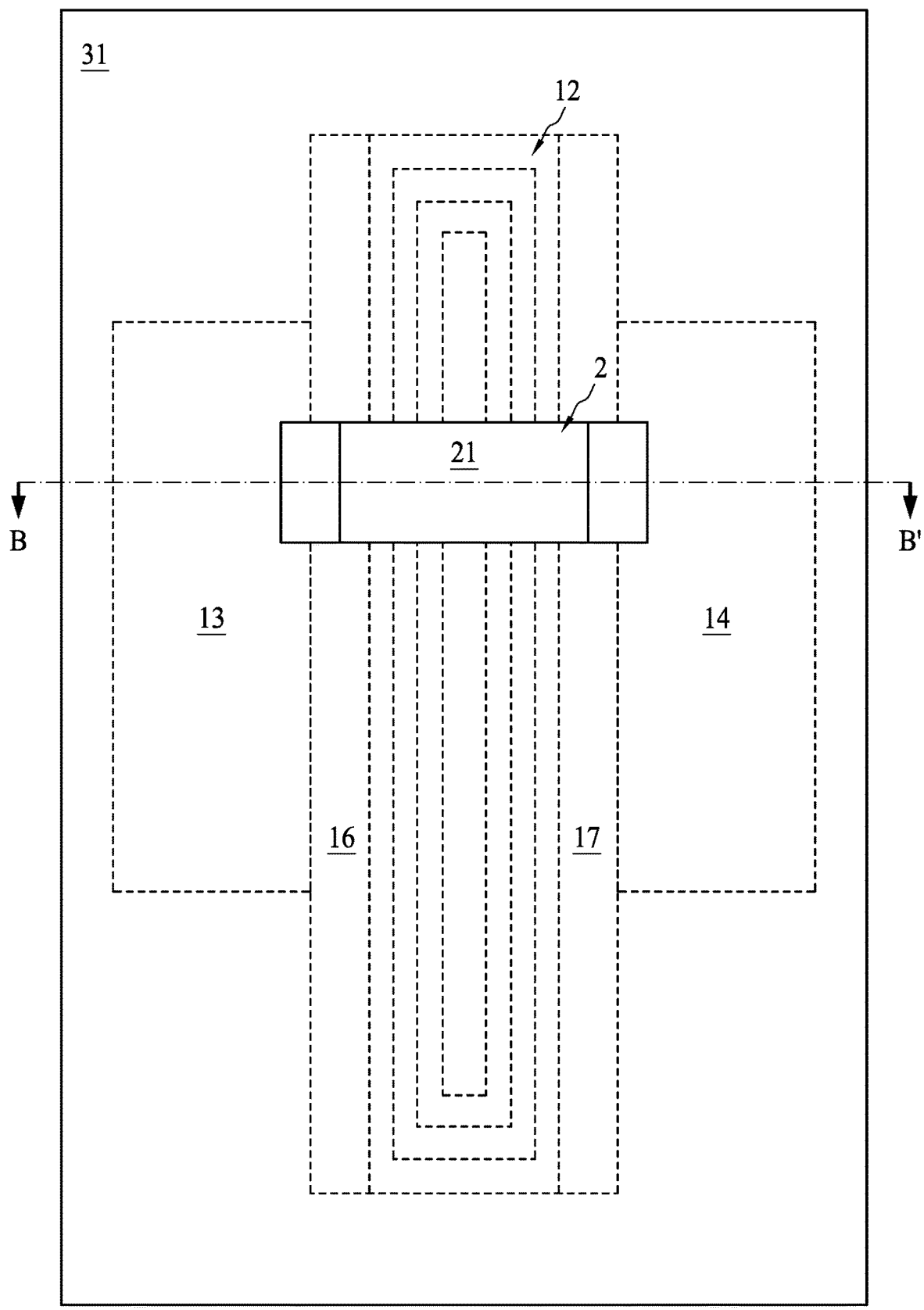

Methods 710, 720 and 730 continue with operation 73, in which, as shown in FIGS. 16 and 17, a dielectric 31 surrounding the alignment structure 2 is formed on the first surface 11. FIG. 16 is a schematic cross sectional view of the semiconductor structure along BB' of FIG. 17. In some embodiments, the dielectric 31 may be formed using a deposition method, e.g., a chemical vapor deposition (CVD), a low pressure CVD, or a physical vapor deposition (PVD) process. In some embodiments, the dielectric 31 surrounds the alignment structure 2, and at least a portion of the top surface of the alignment structure 2 is exposed from a top view. In some embodiments, the dielectric 31 is formed over the alignment structure 2 and the first surface 11, and a chemical mechanical polishing (CMP) operation may be applied to remove a portion of the dielectric 31 to expose the alignment structure 2.

In some embodiments, the dielectric 31 is an inter-layer dielectric (ILD). In some embodiments, the dielectric 31 is made with a material different from that of the alignment structure 2. In some embodiments, the dielectric 31 and the alignment structure 2 have different etch selectivity. In some embodiments, the dielectric 31 includes an oxide such as PSG, BSG, BPSG, TEOS oxide, or the like. In some embodiments, a material of the dielectric 31 may be similar to or different from a material of the first ILD 15.

Figure 18:
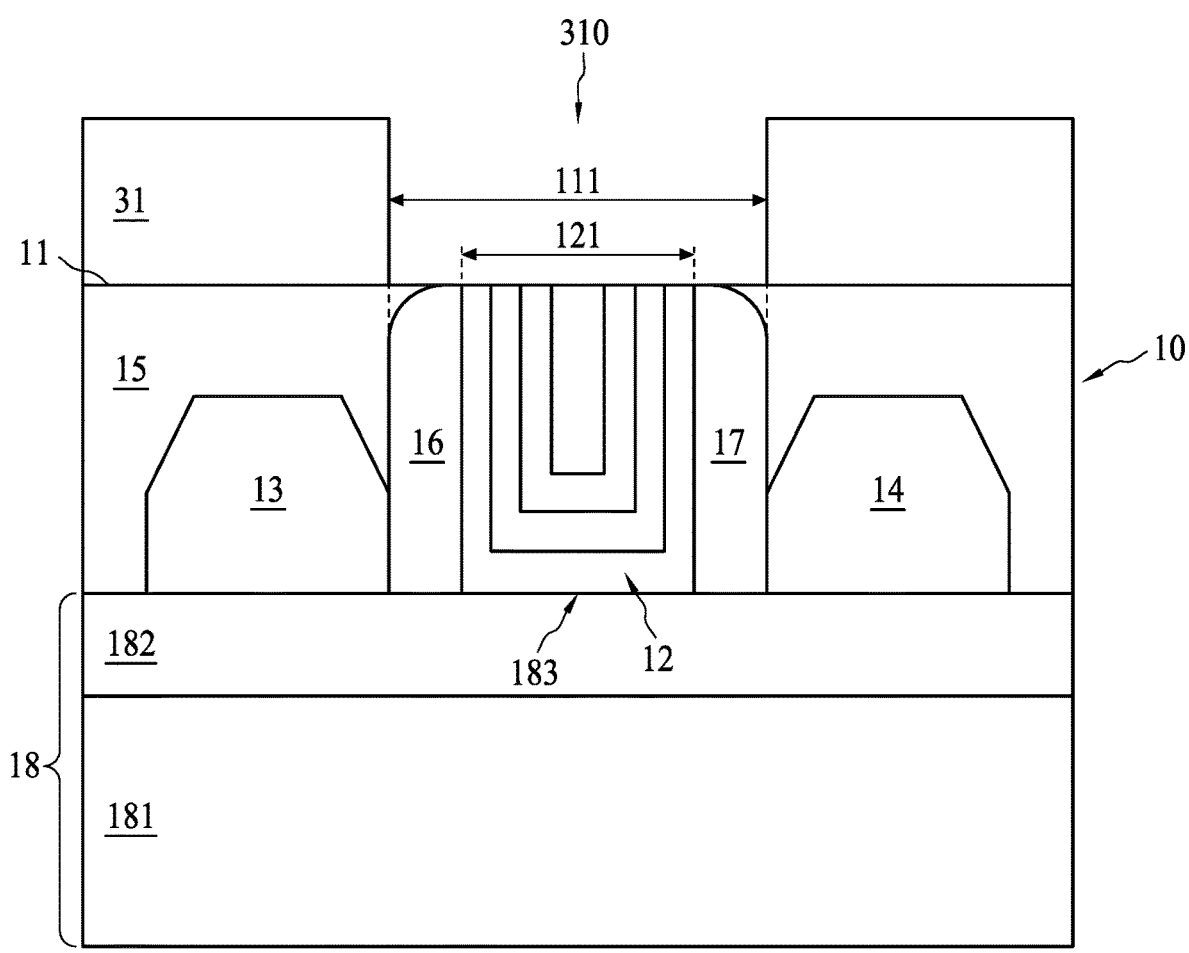

Methods 710, 720 and 730 continue with operation 74, in which, as shown in FIG. 18, the alignment structure 2 is removed to form an opening 310 and expose at least a portion of the top surface 121 of the gate electrode 12. In some embodiments, the alignment structure 2 is removed to form an opening 310 and expose at least a portion of the top surface 121 of the gate electrode 12 and a portion of the first area 111 of the first surface 11 of the wafer 10. In more detail, the etching process of the alignment structure 2 ideally forms an opening 310 exposing the top surface 121 of the gate electrode 12. However, it is difficult to control the exact depth of the etch process, and a portion of the gate electrode 12 may be etched away as well. In some embodiments, the alignment structure 2 is removed to form an opening 310 and expose the portion where the alignment structure 2 overlaps the gate electrode 12 from a top view. The alignment structure 2 may be removed using a suitable etching process, although any suitable process may be used. In some embodiments, the formation process may include etching the alignment structure 2 to form the opening 310.

Methods 710, 720 and 730 continue with operation 75, in which a gate conductor 41 is formed over and in contact with the gate electrode 12. In some embodiments, the gate conductor 41 is formed over and in contact with the exposed portion of the gate electrode 12. In some embodiments, the gate conductor 41 is formed over and in contact with the top surface 121 of the gate electrode 12. In some embodiments, the gate conductor 41 is formed over the first area 111 of the first surface 11 of the wafer 10 and in contact with the top surface 121 of the gate electrode 12. In some embodiments, the gate conductor 41 extends downwardly through the dielectric 15 and engages the gate electrode 12.

Figure 19:
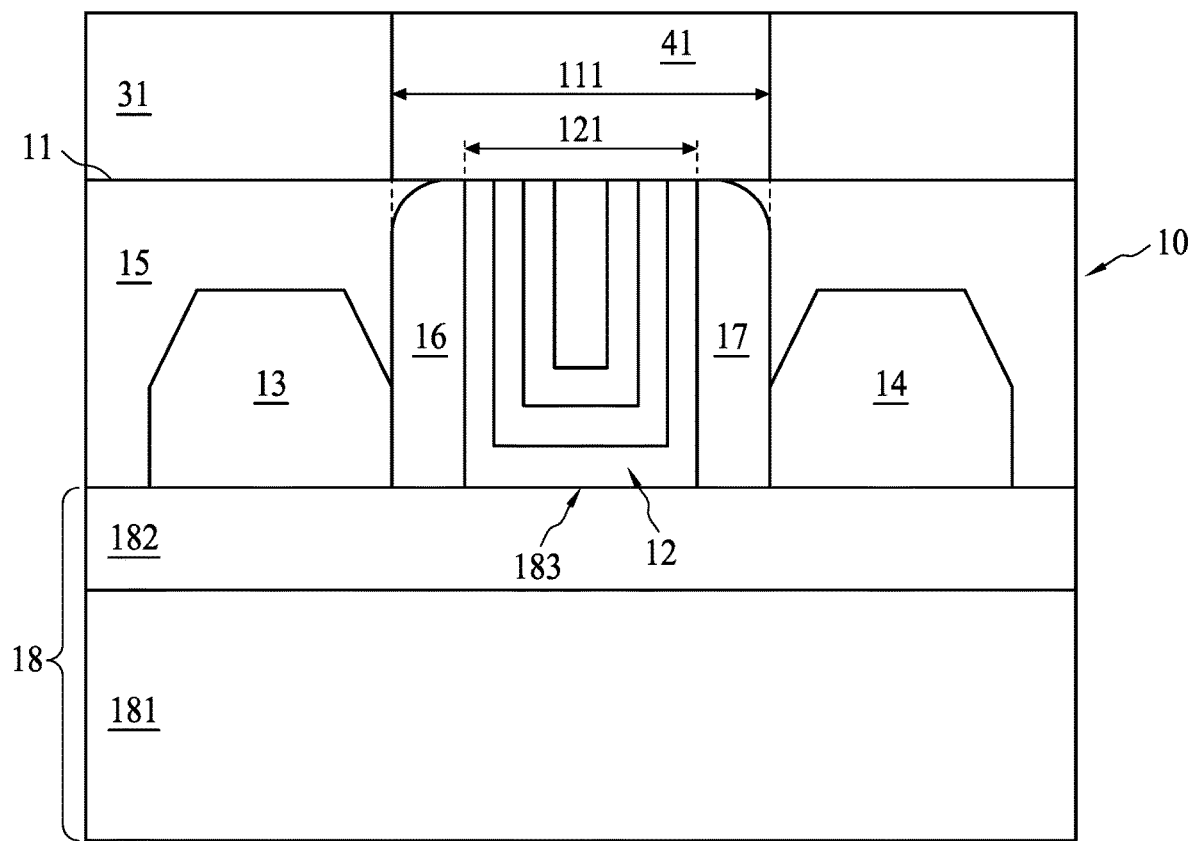

Referring to FIG. 19, in some embodiments, a conductive material(s) is filled into the opening 310, followed by a CMP step to remove excess conductive material(s), and the remaining portions of the conductive material(s) form the gate conductor 41. In some embodiments, the gate conductor 41 may be formed using an electro-chemical plating process, an electroless plating process, PVD, ALD, the like, or a combination thereof. In some embodiments, the conductive material includes gold (Au), silver (Ag), copper (Cu), nickel (Ni), tungsten (W), aluminum (Al), tin (Sn), tantalum (Ta), tantalum nitride (TaN), aluminum copper (AlCu) and/or alloys thereof. In some embodiments, the conductive material includes Cu or W.

Figure 20:
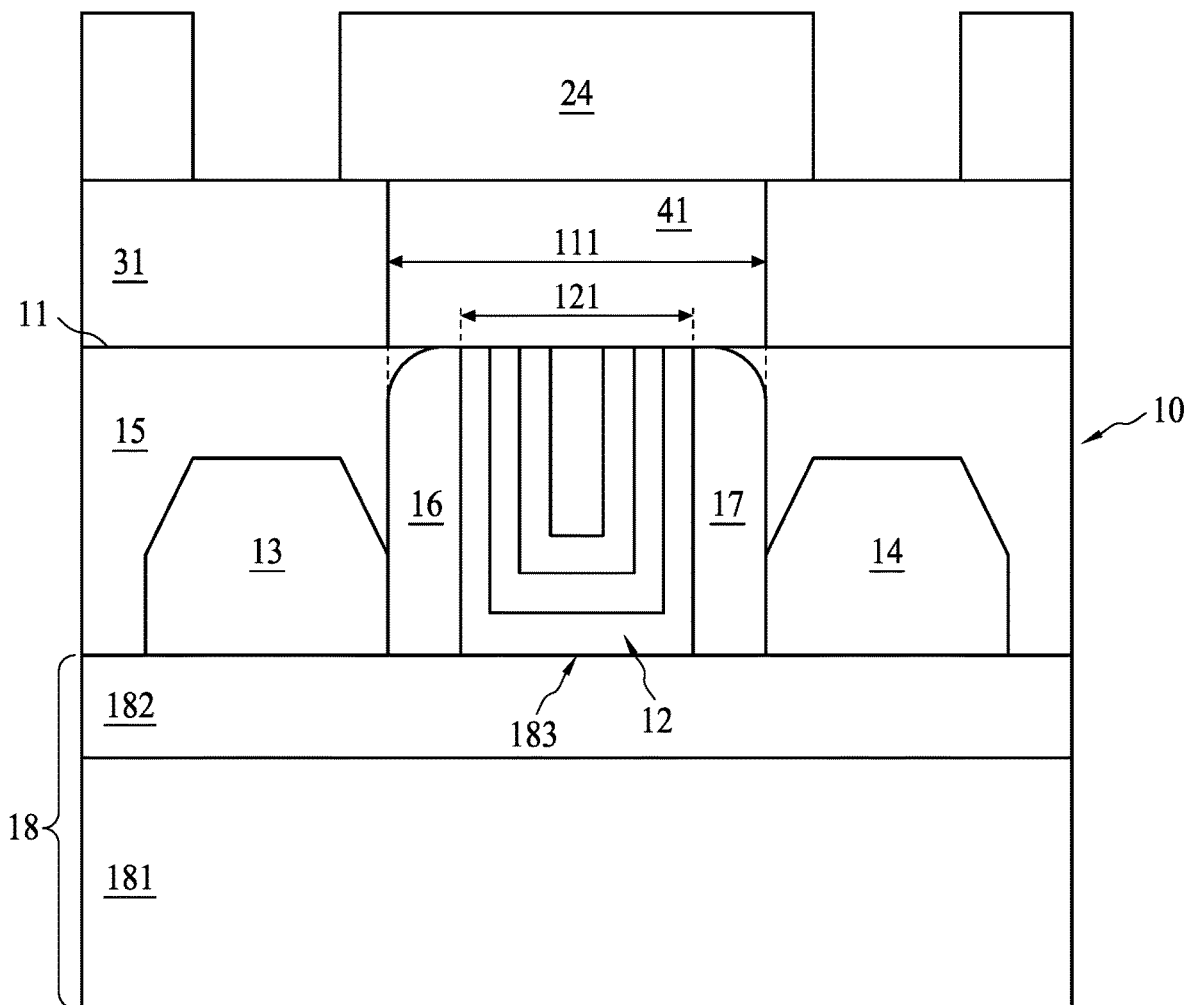

In some embodiments, the method further includes the following operations. Referring to FIG. 20, a third photoresist 24 may be patterned to cover the dielectric 31 and the gate conductor 41 and to expose portions of the dielectric 31 where the source conductor and a drain conductor are desired to be located.

Figure 21:
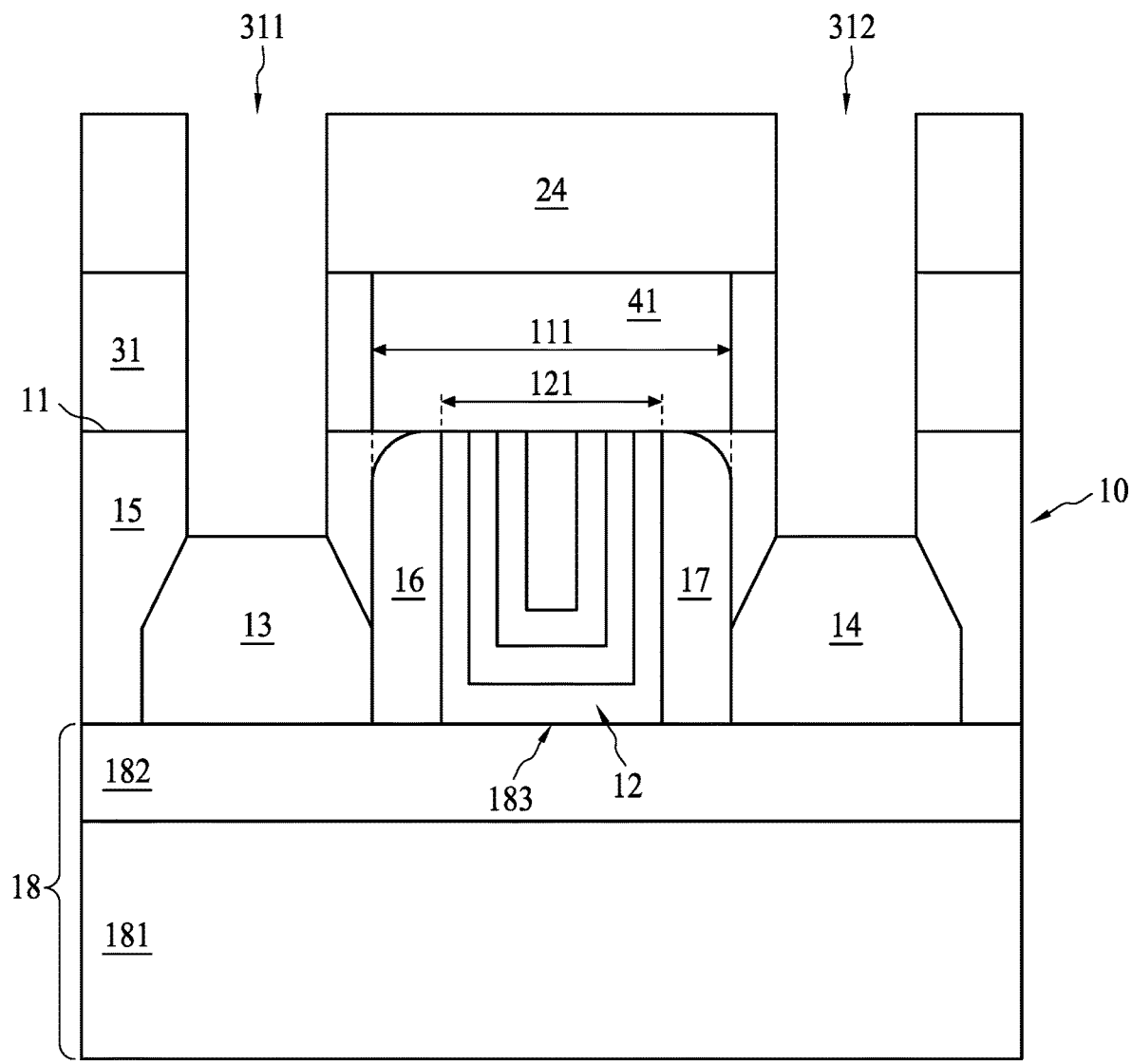

Referring to FIG. 21, once the third photoresist 24 has been formed and patterned, portions of the dielectric 31 and the first dielectric 15 not overlapped by the third photoresist 24 from a top view can be removed by a suitable etching process to expose the source/drain regions 13, 14 and to form the openings 311, 312. The exposed portions of the dielectric 31 and the first dielectric 15 may be removed using an etching process, although any suitable process may be used. In some embodiments, the openings 311, 312 extend downwardly through the dielectric 31 and the first dielectric 15 and respectively expose the source/drain regions 13, 14. In some embodiments, the method further includes removing the third photoresist 24.

Figure 22:
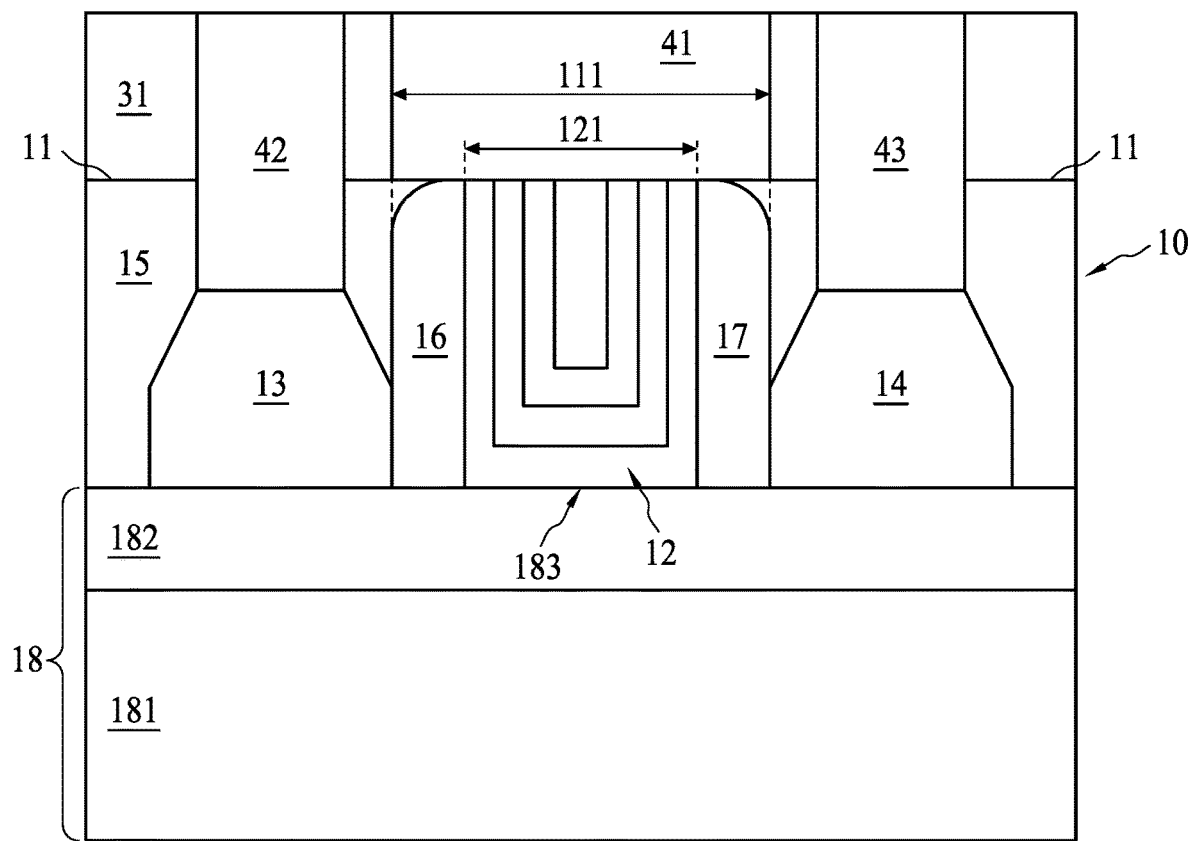

FIG. 22 illustrates the filling of the openings 311, 312 with a conductive material(s), and a source conductor 42 and a drain conductor 43 are formed. In some embodiments, the source conductor 42 and the drain conductor 43 extend downwardly through the dielectric 31 and the first dielectric 15 and respectively engage the source/drain regions 13, 14. In some embodiments, a conductive material(s) is filled into the openings 311, 312, followed by a CMP step to remove excess conductive material(s), and the remaining portions of the conductive material(s) form the source conductor 42 and the drain conductor 43. In some embodiments, the formation of the source conductor 42 and the drain conductor 43 and the formation of the gate conductor 41 can be performed simultaneously.

Figure 23:
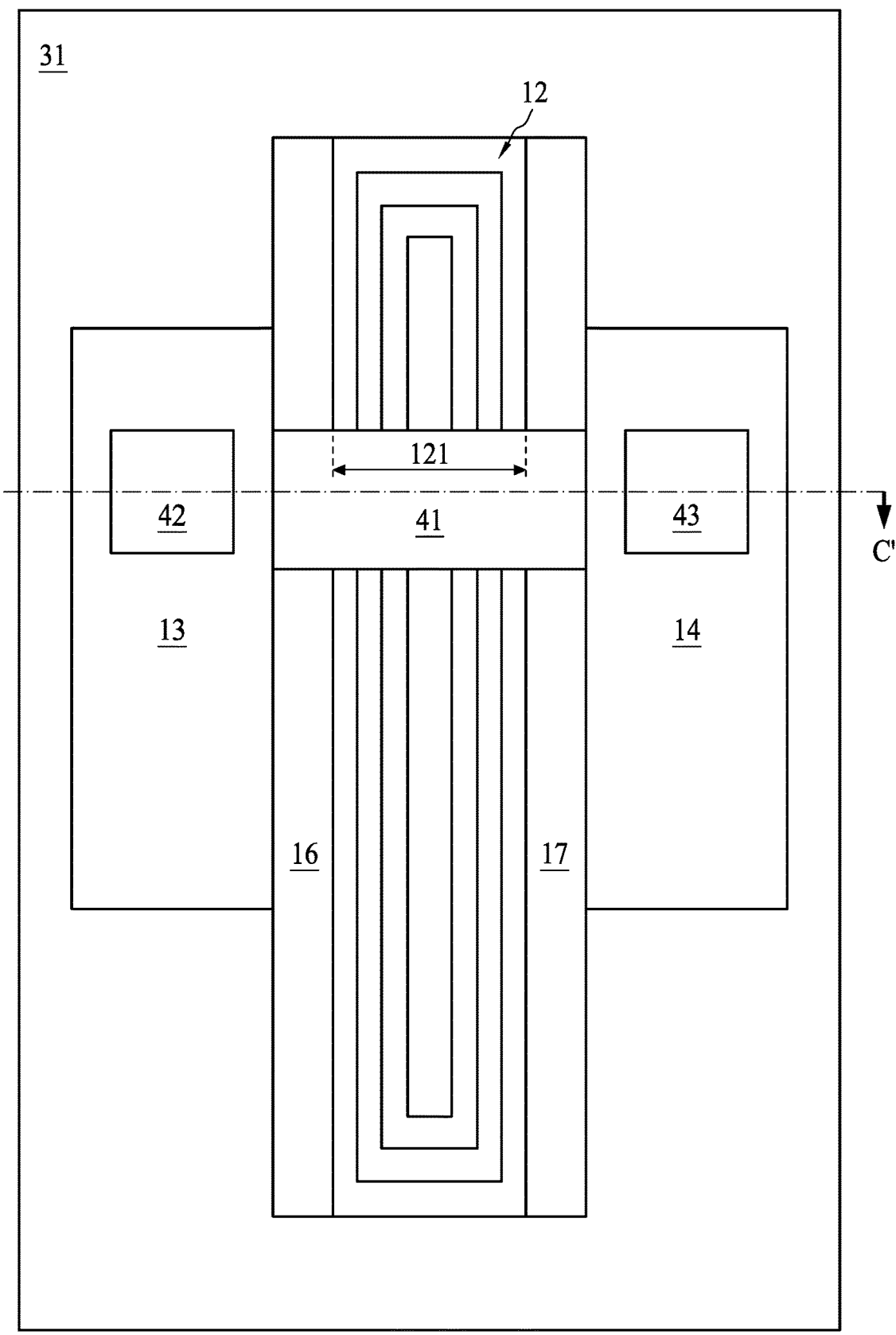

The corresponding top view of the structure shown in FIG. 22 is illustrated in FIG. 23. FIG. 22 is a schematic cross sectional view of the semiconductor structure along CC' of FIG. 23. In the embodiment of FIG. 23, the source conductor 42 and the drain conductor 43 are each square in a top view, but the shapes of the source conductor 42 and the drain conductor 43 are not limited thereto. In some embodiments, the source conductor 42 is substantially identical in size, shape, and material to the drain conductor 43, but in alternative embodiments they may differ in size, shape and/or material. In some embodiments, a larger or smaller number of conductors may engage the source/drain regions 13, 14, and the conductors may be any of a variety of different shapes. A material of the source conductor 42 and the drain conductor 43 may be similar to or different from the material of the gate conductor 41, and the details of the material of the source conductor 42 and the drain conductor 43 are omitted herein for brevity. In some embodiments, the source conductor 42 and the drain conductor 43 are composed of Cu, but the materials of the source conductor 42 and the drain conductor 43 can alternatively include various other suitable conductive materials, such as W.

In some embodiments, the gate conductor 41 may either be aligned with, or offset from, the periphery of the top surface 121 of the gate electrode 12. As shown FIG. 23, in some embodiments, the gate conductor 41 is wider than the top surface 121 of the gate electrode 12. In some embodiments, the gate conductor 41 may overlap the spacers 16 and 17 from a top view, as long as the gate conductor 41 is not in contact with the source/drain regions 13, 14 or with any portion of the oxide diffusion region other than the gate electrode 12. In some embodiments, as shown FIG. 23, the gate conductor 41 may either be aligned with, or offset from, the source conductor 42 and the drain conductor 43. In some embodiments, the semiconductor device shown in FIG. 22 or 23 may represent a portion of a semiconductor device. In some embodiments, after the semiconductor device as shown in FIGS. 22 and 23 is formed, the wafer 10 may be singulated into a plurality chips through a die cutting or singulation process in which typically a mechanical or laser saw is used to cut through the wafer 10 between individual chips or dies.

Figure 24:
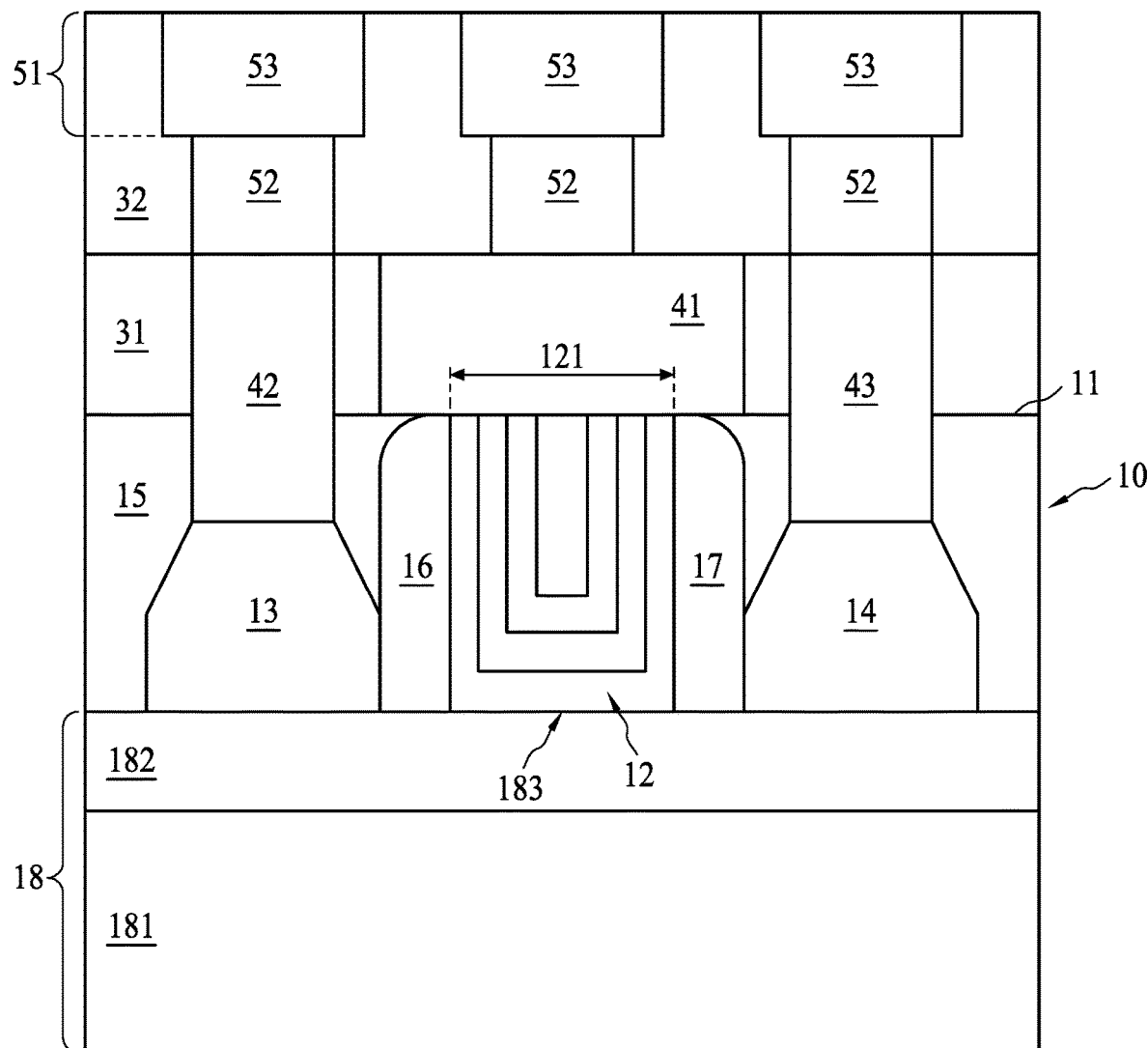
FIG. 24 is an illustration of a semiconductor device according to aspects of the present disclosure in one or more embodiments.

In some embodiments, the method further includes the following operations. FIG. 24 illustrates the semiconductor device of the present disclosure, wherein the semiconductor device may further have a metal layer 51 formed thereon. In some embodiments, as shown in FIG. 24, in subsequent processes, metal vias 52 and metal lines 53 are formed in a second ILD 32, wherein a material of the second ILD 32 may be similar to or different from the material of the first ILD 15 and the dielectric 31, and the details of the material of the second ILD 32 are omitted herein for brevity.

In some embodiments, the metal vias 52 and the metal lines 53 are formed using a dual-damascene process, and hence no noticeable interfaces are formed between the metal vias 52 and the respective overlying metal lines 53. In some embodiments, the metal vias 52 may be formed using a single-damascene process, and the metal lines 53 may also be formed using a single-damascene process. In some embodiments, the metal vias 52 are not formed, and the metal lines 53 are in contact with the gate conductor 41 and the source/drain regions 13, 14. In some embodiments, the metal vias 52 and the metal lines 53 may include a diffusion barrier layer and a copper-containing material over the diffusion barrier layer. In subsequent processes, more metal layers (not shown) may be formed over the metal layer 51. In some embodiments, the semiconductor device shown in FIG. 24 may represent a portion of a semiconductor device. In some embodiments, after the semiconductor device as shown in FIG. 24 is formed, the wafer 10 may be singulated into a plurality chips through a die cutting or singulation process in which typically a mechanical or laser saw is used to cut through the wafer 10 between individual chips or dies.

Accordingly, the present disclosure provides a method of manufacturing a semiconductor device. The method of manufacturing a semiconductor device includes forming an alignment structure 2 on the top surface 121 of the gate electrode. Consequently, the gate conductor can be formed over and in contact with the gate electrode.

In some embodiments, a method of manufacturing a semiconductor device is provided. The method includes providing a wafer having a first surface, wherein the wafer includes a gate electrode having a top surface, and the top surface of the gate electrode is substantially level with the first surface; and forming an alignment structure on the top surface of the gate electrode. The method further includes forming a dielectric surrounding the alignment structure on the first surface, removing the alignment structure to expose at least a portion of the top surface of the gate electrode, and forming a gate conductor over and in contact with the gate electrode.

In some embodiments, another method of manufacturing a semiconductor device is provided. The method includes providing a wafer having a gate electrode and a source/drain region, and disposing an alignment structure over the gate electrode and the source/drain region to overlap at least a portion of the gate electrode without covering the source/drain from a top view. The method further includes forming a dielectric to surround the alignment structure, wherein the dielectric is made with a material different from that of the alignment structure; removing the alignment structure to expose the overlapped portion of the gate electrode; and forming a conductor over and in contact with the exposed gate electrode.

In some embodiments, another method of manufacturing a semiconductor device is provided. The method includes providing a wafer having a substrate and a gate electrode, wherein the substrate has an oxide diffusion region, and the gate electrode is formed over the substrate and in the oxide diffusion region; and disposing an alignment structure over the gate electrode, wherein the alignment structure does not cover the portion of the oxide diffusion region apart from the gate electrode from a top view. The method further includes forming a dielectric surrounding the alignment structure, wherein the dielectric is made with a material different from that of the alignment structure; removing the alignment structure to expose at least a portion of the gate electrode; and forming a conductor in contact with the exposed gate electrode.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:
   providing a wafer having a first surface, wherein the wafer includes a gate electrode having a top surface, and the top surface of the gate electrode is leveled with the first surface;
   forming an alignment layer over the first surface of the wafer and the top surface of the gate electrode;
   forming a photoresist on the alignment layer to cover a portion of the top surface of the gate electrode;
   removing portions of the alignment layer uncovered by the photoresist to form an alignment structure on the top surface of the gate electrode:
   forming a dielectric surrounding the alignment structure on the first surface and over the alignment structure;
   removing a portion of the dielectric to expose the alignment structure by chemical mechanical polishing:
   removing the alignment structure to expose at least a portion of the gate electrode; and forming a gate conductor over and in contact with the gate electrode.

2. The method of claim 1, wherein the gate conductor is embedded in the dielectric.

3. The method of claim 1, wherein the dielectric is made with a material different from the material of the alignment structure.

4. The method of claim 1, wherein the alignment structure includes polysilicon.

5. The method of claim 1, further comprising:
   forming a first alignment structure on a portion of the top surface of the gate electrode; and
   forming a second alignment structure connected to the first alignment structure to form the alignment structure on the top surface of the gate electrode.

6. The method of claim 1, wherein after the alignment structure is removed, an opening is formed in the dielectric, and the gate conductor is formed by filling the opening with a conductive material.

7. The method of claim 1, wherein the gate electrode includes more than one metal layer.

8. The method of claim 1, wherein the wafer further includes a first spacer and a second spacer on opposite sides of the gate electrode and embedded in a first inter-layer dielectric (ILD) of the wafer, wherein a side of the first spacer facing away from the gate electrode and a side of the second spacer facing away from the gate electrode define a first area of the first surface, and the alignment structure is formed on the first area.

9. The method of claim 1, wherein the wafer further includes a source/drain region embedded in a first inter-layer dielectric (ILD) of the wafer, and the method further comprises:
   forming a source conductor and a drain conductor after the gate conductor is formed.

10. The method of claim 9, wherein the source/drain regions are located on opposite sides of the gate electrode.

11. A method of manufacturing a semiconductor device, the method comprising:
    providing a wafer having a first surface, a gate electrode and a source/drain region, wherein the gate electrode has a top surface, and the top surface of the gate electrode is leveled with the first surface of the wafer;
    disposing an alignment structure over the top surface of the gate electrode and the source/drain region to overlap at least a portion of the gate electrode without covering the source/drain region from a top view;
    forming a dielectric over the alignment structure and on the first surface to surround the alignment structure, wherein the dielectric is made with a material different from the material of the alignment structure;
    removing a portion of the dielectric to expose the alignment structure by chemical mechanical polishing;
    removing the alignment structure to expose the overlapped portion of the gate electrode; and
    forming a gate conductor over and in contact with the exposed gate electrode.

12. The method of claim 11, wherein the gate conductor is embedded in the dielectric.

13. The method of claim 11, further comprising:
    forming a first alignment structure on at least a portion of the gate electrode without covering the source/drain region from a top view; and forming a second alignment structure connected to the first alignment structure to form the alignment structure.

14. The method of claim 11, wherein after the alignment structure is removed, an opening is formed in the dielectric, and the gate conductor is formed by filling the opening with a conductive material.

15. The method of claim 11, wherein the wafer has a first surface, the gate electrode has a top surface, the top surface of the gate electrode is leveled with the first surface, and the alignment structure is disposed in at least a portion of the top surface of the gate electrode.

16. The method of claim 11, wherein the alignment structure includes polysilicon.

17. The method of claim 11, further comprising:
    forming a first alignment structure over the gate electrode and the source/drain region to overlap at least a portion of the gate electrode without covering the source/drain region from a top view; and
    forming a second alignment structure connected to the first alignment structure to form the alignment structure over the gate electrode and the source/drain region to overlap at least a portion of the gate electrode without covering the source/drain region from a top view.

18. A method of manufacturing a semiconductor device, the method comprising:
    providing a wafer having a substrate and a gate electrode, wherein the gate electrode is an elongated structure along a first direction extending over the substrate;
    disposing an elongated alignment structure along the first direction extending over the gate electrode, wherein the alignment structure leaves a portion of a source/drain region uncovered, the source/drain region is located on opposite sides of the gate electrode along a second direction, and the first direction is perpendicular to the second direction;
    removing at least a portion of the elongated alignment structure and leaving an alignment structure;
    forming a dielectric surrounding the alignment structure and over the the alignment structure, wherein the dielectric is made with a material different from the material of the alignment structure;
    removing a portion of the dielectric to expose the alignment structure by chemical mechanical polishing;
    removing the alignment structure to expose at least a portion of the gate electrode; and forming a gate conductor in contact with the exposed gate electrode.

19. The method of claim 18, wherein the alignment structure includes polysilicon.

20. The method of claim 18, wherein the gate conductor is embedded in the dielectric.

* * * * *